United States Patent
Ahn et al.

(10) Patent No.: US 7,199,023 B2
(45) Date of Patent: Apr. 3, 2007

(54) ATOMIC LAYER DEPOSITED HFSION DIELECTRIC FILMS WHEREIN EACH PRECURSOR IS INDEPENDENDENTLY PULSED

(75) Inventors: Kie Y. Ahn, Chappaqua, NY (US); Leonard Forbes, Corvallis, OR (US)

(73) Assignee: Micron Technology, Inc., Boise, ID (US)

( * ) Notice: Subject to any disclaimer, the term of this patent is extended or adjusted under 35 U.S.C. 154(b) by 8 days.

(21) Appl. No.: 10/229,903

(22) Filed: Aug. 28, 2002

(65) Prior Publication Data

US 2004/0043569 A1    Mar. 4, 2004

(51) Int. Cl.
- H01L 21/76    (2006.01)
- H01L 21/3205    (2006.01)
- H01L 21/31    (2006.01)
- H01L 21/469    (2006.01)
- H01L 21/4763    (2006.01)

(52) U.S. Cl. ............... 438/439; 438/589; 438/763; 438/785; 438/786

(58) Field of Classification Search ......... 438/589, 438/763, 785, 786, 493, 439; 427/299.29, 427/255.29
See application file for complete search history.

(56) References Cited

U.S. PATENT DOCUMENTS

| | | | |
|---|---|---|---|
| 3,381,114 A | 4/1968 | Nakanuma | 219/385 |
| 4,215,156 A | 7/1980 | Dalal et al. | 427/84 |
| 4,333,808 A | 6/1982 | Bhattacharyya et al. | 204/192 D |
| 4,399,424 A | 8/1983 | Rigby | 338/34 |
| 4,413,022 A | 11/1983 | Suntola et al. | 427/255.2 |
| 4,590,042 A | 5/1986 | Drage | 422/186.06 |
| 4,647,947 A | 3/1987 | Takeoka et al. | 346/135.1 |
| 4,767,641 A | 8/1988 | Kieser et al. | 427/38 |
| 4,920,071 A | 4/1990 | Thomas | 437/188 |
| 4,993,358 A | 2/1991 | Mahawili | 118/715 |
| 5,006,192 A | 4/1991 | Deguchi | 156/345 |

(Continued)

FOREIGN PATENT DOCUMENTS

EP    1096042    5/2001

(Continued)

OTHER PUBLICATIONS

Shanware et al., "Reliability Evaluation of HfSiON Gate Dielectric Film with 12.8 Å SiO2 Thickness", IEEE, 2001, pp. 6.61-4.*

(Continued)

Primary Examiner—William M. Brewster
(74) Attorney, Agent, or Firm—Schwegman, Lundberg, Woessner & Kluth, P.A.

(57) ABSTRACT

A dielectric film containing atomic layer deposited HfSiON and a method of fabricating such a dielectric film produce a reliable dielectric layer having an equivalent oxide thickness thinner than attainable using $SiO_2$. The HfSiON layer thickness is controlled by repeating for a number of cycles a sequence including pulsing a hafnium containing precursor into a reaction chamber, pulsing an oxygen containing precursor into the reaction chamber, pulsing a silicon containing precursor into the reaction chamber, and pulsing a nitrogen containing precursor until a desired thickness is formed. Dielectric films containing atomic layer deposited HfSiON are thermodynamically stable such that the HfSiON will have minimal reactions with a silicon substrate or other structures during processing.

72 Claims, 8 Drawing Sheets

U.S. PATENT DOCUMENTS

| | | | |
|---|---|---|---|
| 5,595,606 A | 1/1997 | Fujikawa et al. | 118/725 |
| 5,735,960 A | 4/1998 | Sandhu et al. | 118/723 IR |
| 5,795,808 A | 8/1998 | Park | 438/301 |
| 5,801,105 A | 9/1998 | Yano et al. | 438/785 |
| 5,810,923 A | 9/1998 | Yano et al. | 117/84 |
| 5,822,256 A | 10/1998 | Bauer et al. | 365/200 |
| 5,828,080 A | 10/1998 | Yano et al. | 257/43 |
| 5,840,897 A | 11/1998 | Kirlin et al. | 546/2 |
| 5,916,365 A | 6/1999 | Sherman | 117/92 |
| 5,950,925 A | 9/1999 | Fukunaga et al. | 239/132.3 |
| 6,010,969 A | 1/2000 | Vaartstra | 438/758 |
| 6,013,553 A | 1/2000 | Wallace et al. | 438/287 |
| 6,020,024 A | 2/2000 | Maiti et al. | 427/248.1 |
| 6,027,961 A | 2/2000 | Maiti et al. | 438/199 |
| 6,057,271 A | 5/2000 | Kenjiro et al. | 505/475 |
| 6,059,885 A | 5/2000 | Ohashi et al. | 118/730 |
| 6,110,529 A | 8/2000 | Gardiner et al. | 427/250 |
| 6,161,500 A | 12/2000 | Kopacz et al. | 118/723 E |
| 6,171,900 B1 | 1/2001 | Sun | 438/240 |
| 6,200,893 B1 | 3/2001 | Sneh | |
| 6,203,613 B1 | 3/2001 | Gates et al. | 117/104 |
| 6,206,972 B1 | 3/2001 | Dunham | 118/715 |
| 6,211,035 B1 | 4/2001 | Moise et al. | 438/396 |
| 6,217,645 B1 | 4/2001 | Vaartstra | 106/287.18 |
| 6,225,168 B1 | 5/2001 | Gardner et al. | 438/287 |
| 6,225,237 B1 | 5/2001 | Vaartstra | 438/778 |
| 6,273,951 B1 | 8/2001 | Vaartstra | 117/104 |
| 6,281,144 B1 | 8/2001 | Cleary et al. | 438/780 |
| 6,291,866 B1 | 9/2001 | Wallace et al. | 257/410 |
| 6,297,539 B1 | 10/2001 | Ma et al. | 257/410 |
| 6,300,203 B1 | 10/2001 | Buynoski et al. | 438/287 |
| 6,302,964 B1 | 10/2001 | Umotoy et al. | 118/715 |
| 6,303,481 B2 | 10/2001 | Park | 438/591 |
| 6,313,035 B1 | 11/2001 | Sandhu et al. | 438/681 |
| 6,348,386 B1 | 2/2002 | Gilmer | 438/288 |
| 6,368,941 B1 | 4/2002 | Chen et al. | 438/424 |
| 6,380,579 B1 | 4/2002 | Nam et al. | 257/306 |
| 6,387,712 B1 | 5/2002 | Yano et al. | 438/3 |
| 6,391,769 B1 | 5/2002 | Lee et al. | 438/643 |
| 6,420,279 B1 | 7/2002 | Ono et al. | 438/785 |
| 6,432,779 B1 | 8/2002 | Hobbs et al. | 438/287 |
| 6,441,417 B1 | 8/2002 | Zhang et al. | |
| 6,444,039 B1 | 9/2002 | Nguyen | 118/715 |
| 6,444,592 B1 | 9/2002 | Ballantine et al. | |
| 6,445,023 B1 | 9/2002 | Vaartstra et al. | 257/295 |
| 6,448,192 B1 | 9/2002 | Kaushik | 438/785 |
| 6,451,641 B1 * | 9/2002 | Halliyal et al. | 438/200 |
| 6,455,717 B1 | 9/2002 | Vaartstra | 556/1 |
| 6,458,701 B1 | 10/2002 | Chae et al. | 438/680 |
| 6,461,970 B1 | 10/2002 | Yin | 438/710 |
| 6,465,334 B1 | 10/2002 | Buynoski et al. | 438/591 |
| 6,482,740 B2 | 11/2002 | Soininen et al. | 438/686 |
| 6,495,436 B2 | 12/2002 | Ahn et al. | 438/591 |
| 6,498,063 B1 | 12/2002 | Ping | 438/253 |
| 6,509,280 B2 | 1/2003 | Choi | |
| 6,514,828 B2 | 2/2003 | Ahn et al. | 438/297 |
| 6,521,911 B2 | 2/2003 | Parsons et al. | 257/52 |
| 6,527,866 B1 | 3/2003 | Matijasevic et al. | 118/719 |
| 6,534,357 B1 | 3/2003 | Basceri et al. | |
| 6,534,420 B2 | 3/2003 | Ahn et al. | 438/768 |
| 6,537,613 B1 | 3/2003 | Senzaki et al. | 427/250 |
| 6,544,875 B1 * | 4/2003 | Wilk | 438/591 |
| 6,551,893 B1 | 4/2003 | Zheng et al. | |
| 6,586,349 B1 | 7/2003 | Jeon et al. | |
| 6,596,583 B2 | 7/2003 | Agarwal et al. | 438/255 |
| 6,613,656 B2 | 9/2003 | Li | 438/584 |
| 6,627,503 B2 | 9/2003 | Ma et al. | 438/287 |
| 6,632,279 B1 | 10/2003 | Ritala et al. | |
| 6,639,267 B2 | 10/2003 | Eldridge | 257/310 |
| 6,645,882 B1 * | 11/2003 | Halliyal et al. | 438/785 |
| 6,660,660 B2 | 12/2003 | Haukka et al. | 438/778 |
| 6,670,284 B2 | 12/2003 | Yin | 438/759 |
| 6,673,701 B1 | 1/2004 | Marsh et al. | 438/493 |
| 6,674,138 B1 * | 1/2004 | Halliyal et al. | 257/411 |
| 6,696,332 B2 | 2/2004 | Visokay et al. | 438/216 |
| 6,709,989 B2 | 3/2004 | Ramdani et al. | |
| 6,713,846 B1 | 3/2004 | Senzaki | 257/635 |
| 6,730,575 B2 | 5/2004 | Eldridge | 257/310 |
| 6,750,066 B1 * | 6/2004 | Cheung et al. | 438/3 |
| 6,767,582 B1 * | 7/2004 | Elers | 427/253 |
| 6,767,795 B2 | 7/2004 | Ahn et al. | |
| 6,780,704 B1 | 8/2004 | Raaijmakers et al. | |
| 6,787,413 B2 | 9/2004 | Ahn et al. | |
| 6,790,791 B2 | 9/2004 | Ahn et al. | |
| 6,821,873 B2 * | 11/2004 | Visokay et al. | 438/591 |
| 6,893,984 B2 | 5/2005 | Ahn et al. | |
| 6,900,122 B2 | 5/2005 | Ahn et al. | |
| 6,921,702 B2 | 7/2005 | Ahn et al. | |
| 6,930,346 B2 | 8/2005 | Ahn et al. | |
| 7,026,694 B2 | 4/2006 | Ahn et al. | |
| 7,045,430 B2 | 5/2006 | Ahn et al. | |
| 7,049,192 B2 | 5/2006 | Ahn et al. | |
| 7,064,058 B2 | 6/2006 | Ahn et al. | |
| 2001/0002280 A1 | 5/2001 | Sneh | 427/255.28 |
| 2001/0009695 A1 * | 7/2001 | Saanila et al. | 427/255.39 |
| 2002/0001971 A1 | 1/2002 | Cho | |
| 2002/0086507 A1 * | 7/2002 | Park et al. | 438/585 |
| 2002/0089023 A1 | 7/2002 | Yu et al. | 257/411 |
| 2002/0111001 A1 | 8/2002 | Ahn | |
| 2002/0122885 A1 | 9/2002 | Ahn | |
| 2002/0142536 A1 | 10/2002 | Zhang et al. | |
| 2002/0146916 A1 * | 10/2002 | Irino et al. | 438/785 |
| 2002/0155688 A1 | 10/2002 | Ahn et al. | 438/592 |
| 2002/0155689 A1 | 10/2002 | Ahn et al. | 29/76 |
| 2002/0177282 A1 | 11/2002 | Song | |
| 2002/0192974 A1 | 12/2002 | Ahn et al. | 438/722 |
| 2002/0192975 A1 | 12/2002 | Ahn | |
| 2002/0192979 A1 | 12/2002 | Ahn | |
| 2003/0003635 A1 | 1/2003 | Paranjpe et al. | |
| 2003/0017717 A1 | 1/2003 | Ahn et al. | 437/768 |
| 2003/0048666 A1 | 3/2003 | Eldridge | 365/185.28 |
| 2003/0049942 A1 | 3/2003 | Haukka et al. | |
| 2003/0104666 A1 | 6/2003 | Bojarczuk, Jr. et al. | |
| 2003/0181060 A1 | 9/2003 | Asai et al. | |
| 2003/0207032 A1 | 11/2003 | Ahn et al. | 427/255.34 |
| 2003/0207540 A1 | 11/2003 | Ahn et al. | 438/287 |
| 2003/0207593 A1 | 11/2003 | Derderian | 438/778 |
| 2003/0227033 A1 | 12/2003 | Ahn et al. | 257/213 |
| 2003/0232511 A1 | 12/2003 | Metzner et al. | 438/785 |
| 2003/0235961 A1 | 12/2003 | Metzner et al. | |
| 2004/0023461 A1 | 2/2004 | Ahn et al. | |
| 2004/0038554 A1 | 2/2004 | Ahn | |
| 2004/0043635 A1 | 3/2004 | Vaartstra | |
| 2004/0144980 A1 | 7/2004 | Ahn et al. | |
| 2004/0159863 A1 | 8/2004 | Eldridge et al. | |
| 2004/0161899 A1 | 8/2004 | Luo et al. | |
| 2004/0164365 A1 | 8/2004 | Ahn et al. | |
| 2004/0175882 A1 | 9/2004 | Ahn et al. | |
| 2004/0198069 A1 * | 10/2004 | Metzner et al. | 438/785 |
| 2004/0233010 A1 | 11/2004 | Akram et al. | |
| 2004/0262700 A1 | 12/2004 | Ahn et al. | |
| 2005/0009370 A1 | 1/2005 | Ahn | |
| 2005/0020017 A1 | 1/2005 | Ahn et al. | |
| 2005/0023584 A1 | 2/2005 | Derderian et al. | |
| 2005/0023624 A1 | 2/2005 | Ahn et al. | |
| 2005/0023626 A1 | 2/2005 | Ahn et al. | |
| 2005/0026458 A1 | 2/2005 | Basceri et al. | |
| 2005/0029547 A1 | 2/2005 | Ahn et al. | |
| 2005/0077519 A1 | 4/2005 | Ahn et al. | |
| 2005/0087134 A1 | 4/2005 | Ahn | |
| 2005/0124174 A1 | 6/2005 | Ahn et al. | |
| 2005/0138262 A1 | 6/2005 | Forbes | |
| 2005/0140462 A1 | 6/2005 | Ajram et al. | |
| 2005/0145957 A1 | 7/2005 | Ahn et al. | |

| | | |
|---|---|---|
| 2005/0158973 A1 | 7/2005 | Ahn et al. |
| 2005/0164521 A1 | 7/2005 | Ahn et al. |
| 2005/0227442 A1 | 10/2005 | Ahn et al. |
| 2005/0277256 A1 | 12/2005 | Ahn et al. |
| 2005/0280067 A1 | 12/2005 | Ahn et al. |
| 2006/0000412 A1 | 1/2006 | Ahn et al. |
| 2006/0001151 A1 | 1/2006 | Ahn et al. |
| 2006/0003517 A1 | 1/2006 | Ahn et al. |

FOREIGN PATENT DOCUMENTS

| | | |
|---|---|---|
| EP | 1124262 | 8/2001 |
| JP | 62-199019 | 9/1987 |
| JP | 5090169 | 4/1993 |
| JP | 2001-332546 | 11/2001 |
| WO | WO-01/97257 | 12/2001 |
| WO | WO-02/31875 | 4/2002 |

OTHER PUBLICATIONS

Aarik, Jaan , et al., "Texture development in nanocrystalline hafnium dioxide thin films grown by atomic layer deposition", *Journal of Crystal Growth*, (2000),pp. 105-113.

Bright, A A., et al., "Low-rate plasma oxidatin of Si in a dilute oxygen/helium plasma for low-temperature gate quality Si/Sio2 interfaces", *Applied Physics Letters*, (Feb. 1991),pp. 619-621.

Cheng, Baohong , et al., "The Impact of High-k Gate Dielectrics and Metal Gate Electrodes on Sub-100nm MOSFET's", *IEEE Transactions on Electron Devices*, (1999), 1537-1544.

Desu, S.B. , "Minimization of Fatigue in Ferroelectric Films", *Phys. Stat. Sol. (a) 151*, (1995),467-480.

Engelhardt, M. , "Modern Applications of Plasma Etching and Patterning in Silicon Process Technology", *Contrib. Plasma. Phys.*, 39(5), (1999),pp. 473-478.

Fuyuki, Takashi , "Electronic Properties of the Interface between Si and TiO2 Deposited at Very Low Temperatures", *Journal of Applied Physics*, (1986),pp. 1288-1291.

Fuyuki, Takashi , et al., "Initial stage of ultra-thin SiO2 formation at low temperatures using activated oxygen", *Applied Surface Science*, (1997),pp. 123-126.

Gartner, M , "Spectroellipsometric characterization of lanthanide-doped TiO2 films obtained via the sol-gel technique", *Thin Solid Films*, (1993),pp. 561-565.

Geller, S. , et al., "Crystallographic Studies of Perovskite-like Compounds. II. Rare Earth Aluminates", *Acta Cryst. vol. 9*, (May 29, 1956),pp. 1019-1025.

Giess, E. A., et al., "Lanthanide gallate perovskite-type substrates for epitaxial, high-Tc superconducting Ba2YCu3O7- films", *IBM J. Res. Develop. vol. 34*, No. 6, (Nov. 6, 1990),pp. 916-926.

Hirayama, Masaki , et al., "Low-Temperature Growth of High-Integrity Silicon Oxide Films by Oxygen Radical Generated in High Density Krypton Plasma", *IEDM Technical Digest*, (1999),249-252.

Hubbard, K. J., et al., "Thermodynamic stability of binary oxides in contact with silicon", *J. Mater. Res.*, (Nov. 1996),2757-2776.

Hunt, C. E., et al., "Direct bonding of micromachined silicon wafers for laser diode heat exchanger applications", *J. Micromech. Microeng.*, 1, (1991),pp. 152-156.

Jeong, Chang-Wook , et al., "Plasma-Assisted Atomic Layer Growth of High-Quality Aluminum Oxide Thin Films", *Japanese Journal of Applied Physics*, (Jan. 2001),pp. 285-289.

Kawai, Y , et al., "Ultra-low temperature growth of high-integrity gate oxide films by low-energy ion-assisted oxidation", *Applied Physics Letters*, (Apr. 1994),pp. 2223-2225.

Keomany, D , "Sol gel preparation of mixedcerium-titanium oxide thin films", *Solar Energy Materials and Solar Cells*, (1994),pp. 429-441.

Kim, C T., et al., "Application of Al2O3 Grown by Atomic Layer Deposition to DRAM and FeRAM", *International Symposium in Integrated Ferroelectrics*, (Mar. 2000),pp. 316.

Kim, D. , et al., "Atomic Control of Substrate Termination and Heteroepitaxial Growth of SrTiO3/LaAlO3 Films", *Journal of the Korean Physical Society vol. 36 No. 6*, (Jun. 2000),444-448.

Kim, Y , et al., "Substrate dependence on the optical properties of Al2O3 films grown by atomic layer deposition", *Applied Physics Lettters*, (Dec. 1997),pp. 3604-3606.

Krauter, G. , et al., "Room Temperature Silicon Wafer Bonding with Ultra-Thin Polymer Films", *Advanced Materials*, 9(5), (1997),pp. 417-420.

Kukli, Kaupo , "Atomic Layer Deposition of Titanium Oxide from TiI4 and H2O2", *Chemical Vapor Deposition*, (2000),pp. 303-310.

Kukli, K , et al., "Controlled Growth of Yttrium Oxysulphide Thin Films by Atomic Layer Deposition", *Materials Science Forum*, (1999),pp. 216-221.

Lee, A. E., et al., "Epitaxially grown sputtered LaAlO3 films", *Appl. Phys. Lett. 57* (19), (Nov. 5, 1990),pp. 2019-2021.

Lee, Cheng-Chung , "Ion-assisted depositon of silver thin films", *Thin Solid Films*, (2000),pp. 95-97.

Lee, Dong H., "Metalorganic chemical vapor deposition of Tio2:n anatase thin film on Si substrate", *Applied Physics Lettters*, (Feb. 1995),pp. 815-816.

Lee, L. P., et al., "Monolithic 77 K dc SQUID magnetometer", *Appl. Phys. Lett. 59*(23), (Dec. 2, 1991),pp. 3051-3053.

Leskela, M , et al., "ALD precursor chemistry: Evolution and future challenges", *Journal de Physique*, (1999),pp. 837-852.

Liu, C. T., "Circuit Requirement and Integration Challenges of Thin Gate Dielectrics for Ultra Small MOSFET's", *IEDM*, (1998),747-750.

Liu, Y C., et al., "Growth of ultrathin SiO2 by surface irradiation with an O2+Ar election cyclotron resonance microwave plasma at low temperatures", *Journal of Applied Physics*, (Feb. 1999),pp. 1911-1915.

Lucovsky, G , et al., "Microscopic model for enhanced dielectric constants in low concentration SiO2-rich noncrystalline Zr and Hf silicate alloys", *Applied Physics Letters*, (Oct. 2000),pp. 2912-2914.

Martin, P J., et al., "Ion-beam-assisted deposition of thin films", *Applied Optics*, (Jan. 1983),pp. 178-184.

Molodyk, A. A., et al., "Volatile Surfactant-Assisted MOCVD: Application to LaAl03 Thin Film Growth", *Chem. Vap. Deposition vol. 6*, No. 3, (2000,),pp. 133-138.

Molsa, Heini , et al., "Growth of Yttrium Oxide Thin Films from B-Diketonate Precursor", *Advanced Materials for Optics and Electronics*, (1994),pp. 389-400.

Muller, D. A., "The electronic structure at the atomic scale of ultrathin gate oxides", *Nature, vol. 399*, No. 6738, Jun. 24, 1999, (1999),758-61.

Nakajima, Anri , et al., "NH3-annealed atomic-layer-deposited silicon nitride as a high-k gate dielectric with high reliability", *Applied Physics Letters*, (Feb. 2002),pp. 1252-1254.

Neumayer, D A., et al., "Materials characterizationof ZrO2-SiO2 and HfO2-SiO2 binary oxides deposited by chemical solution deposition", *Journal of Applied Physics*, (Aug. 2001),pp. 1801-1808.

Nieminen, Minna , et al., "Formation and stability of lanthanum oxide thin films deposited from B-diketonate presursor", *Applied Surface Science*, (2001),pp. 155-165.

Ohring, Milton , "The Materials Science of Thin Films", *Academic Press Inc.*, (1992),118,121,125.

Osten, H. J., et al., "High-k Gate Dielectrics with Ultra-low Leakage Current Based on Praseodymium Oxide", *IEEE*, (2000),653-656.

Pan, Tung M., et al., "High Quality Ultrathin CoTiO3 High-k Gate Dielectrics", *Electrochemical and Solid-State Letters*, (2000),pp. 433-434.

Pan, Tung M., et al., "High-k cobalt-titanium oxide dielectrics formed by oxidation of sputtered Co/Ti or Ti/Co films", *Applied Physcis Letters*, (Mar. 2001),pp. 1439-1441.

Park, Byung-Eun , et al., "Electrical properties of LaAlO3/Si and Sr0.8Bi2.2Ta2O9/LaAlO3/Si structures", *Applied Physics Letters*, vol. 79, No. 6,(Aug. 6, 2001),pp. 806-808.

QI, Wen-Jie , et al., "MOSCAP and MOSFET characteristics using Zr02 gate dielectric deposited directly on Si", *IEDM Technical Digest*, (1999),145-148.

Rayner Jr., G , et al., "the Structure of Plasma-Deposited and Annealed Pseudo-Binary ZrO2-SiO2 Alloys", *Material Res. Soc. Symp.*, (2000),pp. C1.3.1-C1.3.9.

Ritala, Mikko, "Atomic Layer Epitaxy Growth of Titanium, Zirconium and Hafnium Dioxide Thin Films", *Annales Academiae Scientiarum Fennicae*, (1994),pp. 24-25.

Rotondaro, A L., et al., "Advanced CMOS Transistors with a Novel HfSiON Gate Dielectric", *Symposium on VLSI Technology Digest of Technical Papers*, (2002),pp. 148-149.

Saito, Yuji, et al., "Advantage of Radical Oxidation for Improving Reliability of Ultra-Thin Gate Oxide", *2000 Symposium on VLSI Technology Digest of Technical Papers*, (2000),176-177.

Saito, Yuji, et al., "High-Integrity Silicon Oxide Grown at Low-Temperature by Atomic Oxygen Generated in High-Density Krypton Plasma", *Extended Abstracts of the 1999 International Conference on Solid State Devices and Materials*, (1999),152-153.

Shanware, A, et al., "Reliability evaluation of HfSiON gate dielectric film with 12.8 A SiO2 equivalent thickness", *International Electron Devices Meeting*, (2001),pp 137-140.

Shin, Chang H., et al., "Fabriation and Characterization of MFISFET using Al2O3 Insulting Layer for Non-Volatile Memory", *12th International Symposium in Integrated Ferroelectrics*, (Mar. 2000),1-9.

Sneh, Ofer, et al., "Thin film atomic layer deposition equipment for semiconductor processing", *Thin Solid Films*, (2002),pp. 248-261.

Song, Hyun-Jung, et al., "Atomic Layer Deposition of Ta2O5 Films Using Ta(OC2H5)5 and NH3", *Mat. Res. Soc. Symp. Proc.*, (1999),pp. 469-471.

Suntola, T., "Atomic Layer Epitaxy", *Handbook of Crystal Growth, 3; Thin Films of Epitaxy, Part B: Growth Mechanics and Dynamics*, Amsterdam,(1994),pp. 601-663.

Suntola, T., "Atomic layer epitaxy", *Thin Solid Films*, 216, (1992),pp. 84-89.

Sze, A M., *Physics of Semiconductor Devices*, (1981),p. 431.

Sze, S M., *Physics of Semiconductor Devices*, (1981),p. 473.

Takemoto, J. H., et al., "Microstrip Resonators and Filters Using High-TC Superconducting Thin Films on LaAlO3", *IEEE Transaction on Magnetics, vol. 27, No. 2*, (Mar. 1991),pp. 2549-2552.

Van Dover, R B., "Amorphous lanthanide-doped TiOx dielectric films", *Applied Physics Letters*, (May 1999),pp. 3041-3043.

Viirola, H, et al., "Controlled growth of antimony-doped tin dioxide thin films by atomic layer epitaxy", *Thin Solid Films*, (1994),pp. 127-135.

Viirola, H, et al., "Controlled growth of tin oxide thin films by atomic layer epitaxy", *Thin Solid Films*, (1994),pp. 144-149.

Visokay, M R., et al., "Application of HfSiON as a gate dielectric material", *Applied Physics Letters*, (Apr. 2002),pp. 3183-3185.

Wilk, G D., et al., "Hafnium and zirconium silicates for advanced gate dielectrics", *Journal of Applied Physics*, (Jan. 2000),pp. 484-492.

Wilk, G. D., et al., "High-K gate dielectrics: Current status and materials properties considerations", *J. Appl. Phys., vol. 89, No. 10*, (May 15, 2001),pp. 5243-5275.

Wolf, Stanley, et al., "Silicon Processing for the VLSI Era—vol. I: Process Technology", *Second Edition, Lattice Press, Sunset Beach, California*,(2000),p. 443.

Zucker, O., et al., "Application of Oxygen Plasma Processing to Silicon Direct Bonding", *Sensors and Actuators A, 36*, (1993),pp. 227-231.

Aarik, Jaan, et al., "Influence of substrate temperature on atomic layer growth and properties of HfO/sub 2/ thin films", *Thin Solid Films, 340(1-2)*, (1999),110-116.

Aarik, Jaan, et al., "Phase transformations in hafnium dioxide thin films grown by atomic layer doposition at high temperatures", *Applied Surface Science, 173(1-2)*, (Mar. 2001),15-21.

Forsgren, Katarina, "Atomic Layer Deposition of HfO2 using hafnium iodide", *Conference held in Monterey, California*, (May 2001),1 page.

Guillaumot, B, et al., "75 nm damascene metal gate and high-k integration for advanced CMOS devices", *Technical Digest of International Electron Devices Meeting 2002*, (2002),355-358.

Gusev, E P., et al., "Ultrathin High-K Dielectrics Grown by Atomic Layer Deposition: A Comparative Study of ZrO2, HfO2, Y2O3 and Al2O3", *Electrochemical Society Proceedings Vol. 2001-9*, (2001),189-195.

Gutowski, M J., "Thermodynamic stability of high-K dielectric metal oxides ZrO/sub 2/ and HfO/sub 2/ in contact with Si and SiO/sub 2/", *Applied Physics Letters, 80(11)*, (Mar. 18, 2002),1897-1899.

Kukli, K, et al., "Comparison of hafnium oxide films grown by atomic layer deposition from iodide and chloride precursors", *Thin Solid Films, 416*, (2002),72-79.

Kukli, K J., et al., "Properties of hafnium oxide films grown by atomic layer deposition from hafnium tetraiodide and oxygen", *Journal of Applied Physics, 92(10)*, (Nov. 15, 2002),5698-5703.

Nakajima, Anri, "Soft breakdown free atomic-layer-deposited silicon-nitride/SiO/sub 2/ stack gate dielectrics", *International Electron Devices Meeting. Technical Digest*, (2001),6.5.1-4.

Aarik, Jaan, et al., "Atomic layer growth of epitaxial TiO/sub 2/ thin films from TiCl/sub 4/ and H/sub 2/O on alpha -Al/sub 2/O/sub 3/ substrates", *Journal of Crystal Growth, vol. 242, No. 1-2*, (2002),189-198.

Aarik, Jaan, et al., "Phase transformations in hafnium dioxide thin films grown by atomic layer doposition at high temperatures", *Applied Surface Science, 173*, (2001),15-21.

Alen, Petra, et al., "Atomic Layer deposition of Ta(Al)N(C) thin films using trimethylaluminum as a reducing agent", *Journal of the Electrochemical Society, vol. 148, No. 10*, (Oct. 2001),G566-G571.

Copel, M., et al., "Structure and stability of ultrathin zirconium oxide layers on Si(001)", *Applied Physics Letters, vol. 76, No. 4*, (Jan. 2000),436-438.

De Flaviis, Franco, et al., "Planar microwave integrated phase-shifter design with high purity ferroelectric material", *IEEE Transactions on Microwave Theory & Techniques, vol. 45, No. 6*, (Jun. 1997),963-969.

Forsgren, Katarina, et al., "Atomic Layer Deposition of HfO2 using hafnium iodide", *Conference held in Monterey, California*, (May 2001),1 page.

Gusev, E P., et al., "Ultrathin High-K Dielectrics Grown by Atomic Layer Deposition: A Comparative Study of ZrO2, HfO2, Y2O3 and Al2O3", *Electrochemical Society Proceedings vol. 2001-9*, (2001),189-195.

Iddles, D M., et al., "Relationships between dopants, microstructure and the microwave dielectric properties of ZrO2-TiO2-SnO2 ceramics", *Journal of Materials Science, vol. 27*, (1992),6303-6310.

Jeon, Sanghun, et al., "Excellent Electrical Characteristics of Lanthanide (Pr, Nd, Sm, Gd, and Dy) Oxide and Lanthanide-doped Oxide for MOS Gate Dielectric Applications", *Technical Digest of IEDM*, (2001),471-474.

Kim, Byoung-Youp, et al., "Comparison study for TiN films deposited from different method: chemical vapor deposition and atomic layer deposition", *Mechanisms of Surface and Microstructure Evolution in Deposited Films and Film Structures Symposium (Materials Research Society Symposium Proceedings vol. 672)*, (2001),7.8.1-7.8.6.

Kukli, Kaupo, et al., "Dielectric Properties of Zirconium Oxide Grown by Atomic Layer Deposition from Iodide Precursor", *Journal of The Electrochemical Society, 148(12)*, (2001),F227-F232.

Lee, Byoung H., et al., "Ultrathin Hafnium Oxide with Low Leakage and Excellent Reliability for Alternative Gate Dielectric Application", *Technical Digest of IEDM*, (1999),133-136.

Nakagawara, Osamu, et al., "Electrical properties of (Zr, Sn)TiO4 dielectric thin film prepared by pulsed laser deposition", *J. Appl. Phys., 80(1)*, (Jul. 1996),388-392.

Nakajima, Anri, et al., "Atomic-layer deposition of ZrO/sub 2/ with a Si nitride barrier layer", *Applied Physics Letters, vol. 81, No. 15*, (Oct. 2002),2824-2826.

Perkins, Charles M., et al., "Electrical and materials properties of ZrO2 gate dielectrics grown by atomic layer chemical vapor deposition", *Applied Physics Letters, vol. 78, No. 16*, (Apr. 2001),2357-2359.

Qi, Wen-Jie, et al., "Performance of MOSFETs with ultra thin ZrO2 and Zr-silicate gate dielectrics", *2000 Symposium on VLSI Technology, Digest of Techinical Papers*, (2000), 40-41.

Ramakrishnan, E S., et al., "Dielectric Properties of Radio Frequency Magnetron Sputter Deposited Zirconium Titanate-Based Thin Films", *J. Electrochem. Soc.*, vol. 145, No. 1, (Jan. 1998),358-362.

Ritala, Mikko, et al., "Zirconium dioxide thin films deposited by ALE using zirconium tetrachloride as precursor", *Applied Surface Science*, vol. 75, (1994),333-340.

Tarre, A, et al., "Comparative study of low-temperature chloride atomic-layer chemical vapor deposition of TiO2 and SnO2", *Applied Surface Science*, (2001),111-116.

Van Dover, Robert B., et al., "Deposition of Uniform Zr-Sn-Ti-O films by ON-Axis Reactive Sputtering", *IEEE Electron Device Letters*, vol. 19, No. 9, (Sep. 1998),329-331.

Van Dover, R. B., et al., "Discovery of a useful thin-film dielectric using a composition-spread approach", *Letters to Nature*, (1997),3 pages.

Yamaguchi, Takeshi, et al., "Band Diagram and Carrier Conduction Mechanism in ZrO2/Zr-silicate/Si MIS Structure Fabricated by Pulsed-laser-ablation Deposition", *IEDM*, (2000),19-22.

Zhang, H., "Atomic Layer Deposition of High Dielectric Constant Nanolaminates", *Journal of The Electrochemical Society*, 148(4),(Apr. 2001),F63-F66.

Zhang, H, et al., "High permittivity thin film nanolaminates", *Journal of Applied Physics*, vol. 87, No. 4, (Feb. 2000),1921-1924.

Zhu, W, et al., "HfO2 and HfAlO for CMOS: Thermal Stability and Current Tranport", *IEEE International Electron Device Meeting 2001*, (2001),463-466.

Callegari, A., et al., "Physical and electrical characterization of Hafnium oxide and Hafnium silicate sputtered films", *Journal of Applied Physics*, 90(12), (Dec. 15, 2001),6466-75.

Clark, P, "IMEC Highlights Hafnium, Metal Gates for High-k Integration", *Semiconductor Business News*, at Silicon Strategies.com,(Oct. 11, 2002),2 pages.

Colombo, D., et al., "Anhydrous Metal Nitrates as Volatile Single Source Precursors for the CVD of Metal Oxide Films", *Communications, Department of EE, U of M, Mpls, MN*, (Jul. 7, 1998),3 pages.

Lee, S. J., et al., "Hafnium oxide gate stack prepared by in situ rapid thermal chemical vapor deposition process for advanced gate dielectrics", *Journal of Applied Physics*, 92 (5), (Sep. 1, 2002),2807-09.

Lee, et al., "Ultrathin Hafnium Oxide with Low Leakage and excellent Reliability fo rAlternative Gae Dielecric Application", *IEEE Technical Digest of International Electron Devices Meeting 1999*, (1999),133-136.

Park, Byoung K., et al., "Interfacial reaction between chemically vapor-deposited HfO2 thin films and a HF-cleaned Si substrate during film growth and postannealing", *Applied Physics Letters*, 80(13), (Apr. 1, 2002),2368-70.

Smith, Ryan C., et al., "Chemical Vapour Deposition of the Oxides of Titanium, Zirconium and Hafnium for Use as High-k Materials in Microelectronic Devices. A Carbon-free Precursor for the Synthesis of Hafnium Dioxide", *Advanced Materials for Optics and Electronics*, 10(3-5), (Jun. 29, 2000),105-14.

Yamamoto, K., et al., "Effect of Hf metal predeposition on the properties of sputtered HfO2/Hf stacked gate dielectrics", *Applied Physics Letters*, 81(11), (Sep. 9, 2002),2053-5.

Ahn, Kie Y., et al., "ALD of Amorphous Lanthanide Doped Tiox Films", U.S. Appl. No. 11/092,072, filed Mar. 29, 2005.

Ahn, Kie Y., et al., "Atomic Layer Deposited Hafnium Tantalum Oxide Dielectrics", U.S. Appl. No. 11/029,757, filed Jan. 5, 2005.

Ahn, Kie Y., et al., "Atomic Layer Deposited Lanthanum Aluminum Oxide Dielectric Layer", U.S. Appl. No. 10/930,167, filed Aug. 31, 2004.

Ahn, Kie Y., et al., "Atomic Layer Deposited Lanthanum Hafnium Oxide Dielectrics", U.S. Appl. No. 11/010,529, filed Dec. 13, 2004.

Ahn, Kie Y., et al., "Atomic Layer Deposited Titanium Aluminum Oxide Films", U.S. Appl. No. 10/931,533, filed Aug. 31, 2004.

Ahn, Kie Y., et al., "Atomic Layer Deposition of $Hf_3N_4/HfO_2$ Films as Gate Dielectrics", U.S. Appl. No. 11/063,717, filed Feb. 23, 2005.

Ahn, Kie Y., et al., "Atomic Layer Deposition of Zirconium-Doped Tantalum Oxide Films", U.S. Appl. No. 10/909,959, filed Aug. 2, 2004.

Ahn, Kie Y., et al., "Atomic Layer Deposition of $Zr_3N_4/ZrO_2$ Films as Gate Dielectrics", U.S. Appl. No. 11/058,563, filed Feb. 15, 2005.

Ahn, Kie Y., et al., "Hybrid ALD-CVD of $Pr_xO_y/ZrO_2$ Films as Gate Dielectrics", U.S. Appl. No. 11/010,766, filed Dec. 13, 2004.

Ahn, Kie Y., et al., "Ruthenium Gate for a Lanthanide Oxide Dielectric Layer", U.S. Appl. No. 10/926,812, filed Aug. 26, 2004.

Nakajima, et al., "Atomic-layer-deposited silicon-nitride/$SiO_2$ stacked gate dielectrics for highly reliable p-metal-oxide-semiconductor filed-effect transistors", *Applied Physics Letters*, vol. 77, (Oct. 2000),2855-2857.

Ritala, M., et al., "Atomic layer deposition of oxide thin films with metal alkoxides as oxygen sources", *Science*, 288(5464), (Apr. 14, 2000),319-321.

* cited by examiner

ATOMIC LAYER DEPOSITED HFSION DIELECTRIC FILMS WHEREIN EACH PRECURSOR IS INDEPENDENDENTLY PULSED

RELATED APPLICATIONS

This application is related to the following, co-pending, commonly assigned applications, incorporated herein by reference:

U.S. application Ser. No. 10/137,058, entitled: "Atomic Layer Deposition and Conversion,"

U.S. application Ser. No. 10/137,168, entitled: "Methods, Systems, and Apparatus for Atomic-Layer Deposition of Aluminum Oxides in Integrated Circuits," and U.S. application Ser. No. 09/797,324, entitled: "Methods, Systems, and Apparatus for Uniform Chemical-Vapor Depositions."

FIELD OF THE INVENTION

The invention relates to semiconductor devices and device fabrication. Specifically, the invention relates to dielectric layers and their method of fabrication.

BACKGROUND OF THE INVENTION

The semiconductor device industry has a market driven need to improve speed performance, improve its low static (off-state) power requirements, and adapt to a wide range of power supply and output voltage requirements for it silicon based microelectronic products. In particular, in the fabrication of transistors, there is continuous pressure to reduce the size of devices such as transistors. The ultimate goal is to fabricate increasingly smaller and more reliable integrated circuits (ICs) for use in products such as processor chips, mobile telephones, and memory devices such as dynamic random access memories (DRAMs). The smaller devices are frequently powered by batteries, where there is also pressure to reduce the size of the batteries, and to extend the time between battery charges. This forces the industry to not only design smaller transistors, but to design them to operate reliably with lower power supplies.

Currently, the semiconductor industry relies on the ability to reduce or scale the dimensions of its basic devices, primarily, the silicon based metal-oxide-semiconductor field effect transistor (MOSFET). A common configuration of such a transistor is shown in FIG. 1. While the following discussion uses FIG. 1 to illustrate a transistor from the prior art, one skilled in the art will recognize that the present invention could be incorporated into the transistor shown in FIG. 1 to form a novel transistor according to the invention. A transistor 100 is fabricated in a substrate 110 that is typically silicon, but could be fabricated from other semiconductor materials as well. Transistor 100 has a source region 120 and a drain region 130. A body region 132 is located between source region 120 and drain region 130, where body region 132 defines a channel of the transistor with a channel length 134. A gate dielectric 140 is located on body region 132 with a gate 150 located over gate dielectric 140. Although gate dielectric 140 can be formed from materials other than oxides, gate dielectric 140 is typically an oxide, and is commonly referred to as a gate oxide. Gate 150 may be fabricated from polycrystalline silicon (polysilicon), or other conducting materials such as metal may be used.

In fabricating transistors to be smaller in size and reliably operate on lower power supplies, one important design criteria is the gate dielectric 140. The mainstay for forming the gate dielectric has been silicon dioxide, $SiO_2$. A thermally grown amorphous $SiO_2$ layer provides an electrically and thermodynamically stable material, where the interface of the $SiO_2$ layer with underlying Si provides a high quality interface as well as superior electrical isolation properties. In typical processing, use of $SiO_2$ on Si has provided defect charge densities on the order of $10^{10}/cm^2$, midgap interface state densities of approximately $10^{10}/cm^2$ eV, and breakdown voltages in the range of 15 MV/cm. With such qualities, there would be no apparent need to use a material other than $SiO_2$, but increased scaling and other requirements for gate dielectrics create the need to find other dielectric materials to be used for a gate dielectric.

SUMMARY OF THE INVENTION

A solution to the problems as discussed above is addressed in embodiments according to the teachings of the present invention. In one embodiment, a method of forming a dielectric film includes the formation of a HfSiON layer by atomic layer deposition (ALD). The ALD formation of the HfSiON layer includes pulsing a hafnium precursor into a reaction chamber containing a substrate, pulsing an oxygen containing precursor into the reaction chamber, pulsing a silicon containing precursor into the reaction chamber, and pulsing a nitrogen containing precursor into the reaction chamber. The HfSiON layer thickness is controlled by repeating for a number of cycles the pulsing of these four precursors and the pulsing of purging gases between the pulsing of precursor gases.

A dielectric film containing HfSiON has a larger dielectric constant than silicon dioxide, a relatively small leakage current, and good stability with respect to a silicon based substrate. Embodiments according to the teachings of the present invention include forming capacitors, transistors, memory devices, and electronic systems having dielectric layers containing HfSiON.

Other embodiments include structures for capacitors, transistors, memory devices, and electronic systems with dielectric films containing atomic layer deposited HfSiON Such dielectric films provide a significantly thinner equivalent oxide thickness compared with a silicon oxide layer having the same physical thickness. Alternatively, such dielectric films provide a significantly thicker physical thickness than a silicon oxide layer having the same equivalent oxide thickness.

These and other embodiments, aspects, advantages, and features of the present invention will be set forth in part in the description which follows, and in part will become apparent to those skilled in the art by reference to the following description of the invention and referenced drawings or by practice of the invention. The aspects, advantages, and features of the invention are realized and attained by means of the instrumentalities, procedures, and combinations particularly pointed out in the appended claims.

DETAILED DESCRIPTION OF THE PREFERRED EMBODIMENTS

In the following detailed description of the invention, reference is made to the accompanying drawings which form a part hereof, and in which is shown, by way of illustration, specific embodiments in which the invention may be practiced. These embodiments are described in sufficient detail to enable those skilled in the art to practice the invention. Other embodiments may be utilized and structural, logical, and electrical changes may be made without departing from the scope of the present invention.

The terms wafer and substrate used in the following description include any structure having an exposed surface with which to form the integrated circuit (IC) structure of the invention. The term substrate is understood to include semiconductor wafers. The term substrate is also used to refer to semiconductor structures during processing, and may include other layers that have been fabricated thereupon. Both wafer and substrate include doped and undoped semiconductors, epitaxial semiconductor layers supported by a base semiconductor or insulator, as well as other semiconductor structures well known to one skilled in the art. The term conductor is understood to include semiconductors, and the term insulator or dielectric is defined to include any material that is less electrically conductive than the materials referred to as conductors.

The term "horizontal" as used in this application is defined as a plane parallel to the conventional plane or surface of a wafer or substrate, regardless of the orientation of the wafer or substrate. The term "vertical" refers to a direction perpendicular to the horizontal as defined above. Prepositions, such as "on", "side" (as in "sidewall"), "higher", "lower", "over" and "under" are defined with respect to the conventional plane or surface being on the top surface of the wafer or substrate, regardless of the orientation of the wafer or substrate. The following detailed description is, therefore, not to be taken in a limiting sense, and the scope of the present invention is defined only by the appended claims, along with the full scope of equivalents to which such claims are entitled.

Figure 1:
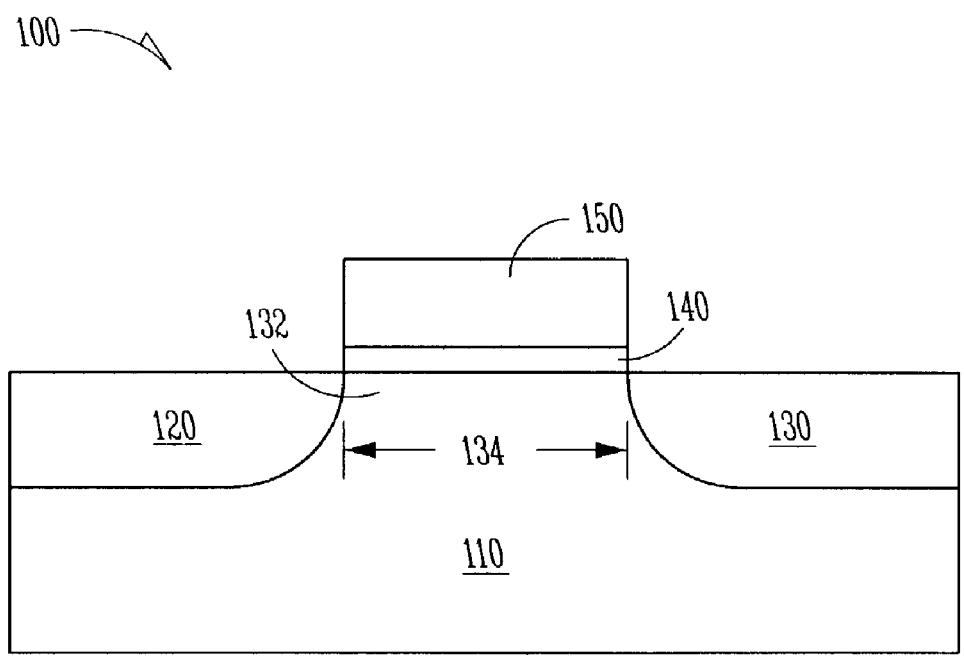
FIG. 1 shows a common configuration of a transistor in which an embodiment of a gate dielectric can be formed according to the teachings of the present invention.

A gate dielectric 140 of FIG. 1, when operating in a transistor, has both a physical gate dielectric thickness and an equivalent oxide thickness ($t_{eq}$). The equivalent oxide thickness quantifies the electrical properties, such as capacitance, of a gate dielectric 140 in terms of a representative physical thickness. $t_{eq}$ is defined as the thickness of a theoretical $SiO_2$ layer that would be required to have the same capacitance density as a given dielectric, ignoring leakage current and reliability considerations.

A $SiO_2$ layer of thickness, t, deposited on a Si surface as a gate dielectric will have a $t_{eq}$ larger than its thickness, t. This $t_{eq}$ results from the capacitance in the surface channel on which the $SiO_2$ is deposited due to the formation of a depletion/inversion region. This depletion/inversion region can result in $t_{eq}$ being from 3 to 6 Angstroms (Å) larger than the $SiO_2$ thickness, t. Thus, with the semiconductor industry driving to someday scale the gate dielectric equivalent oxide thickness to under 10 Å, the physical thickness requirement for a $SiO_2$ layer used for a gate dielectric would be need to be approximately 4 to 7 Å.

Additional requirements on a $SiO_2$ layer would depend on the gate electrode used in conjunction with the $SiO_2$ gate dielectric. Using a conventional polysilicon gate would result in an additional increase in $t_{eq}$ for the $SiO_2$ layer. This additional thickness could be eliminated by using a metal gate electrode, though metal gates are not currently used in typical complementary metal-oxide-semiconductor field effect transistor (CMOS) technology. Thus, future devices would be designed towards a physical $SiO_2$ gate dielectric layer of about 5 Å or less. Such a small thickness requirement for a $SiO_2$ oxide layer creates additional problems.

Silicon dioxide is used as a gate dielectric, in part, due to its electrical isolation properties in a $SiO_2$—Si based structure. This electrical isolation is due to the relatively large band gap of $SiO_2$ (8.9 eV) making it a good insulator from electrical conduction. Signification reductions in its band gap would eliminate it as a material for a gate dielectric. As the thickness of a $SiO_2$ layer decreases, the number of atomic layers, or monolayers of the material in the thickness decreases. At a certain thickness, the number of monolayers will be sufficiently small that the $SiO_2$ layer will not have a complete arrangement of atoms as in a larger or bulk layer. As a result of incomplete formation relative to a bulk structure, a thin $SiO_2$ layer of only one or two monolayers will not form a full band gap. The lack of a full band gap in a $SiO_2$ gate dielectric would cause an effective short between an underlying Si channel and an overlying polysilicon gate. This undesirable property sets a limit on the physical thickness to which a $SiO_2$ layer can be scaled. The minimum thickness due to this monolayer effect is thought to be about 7–8 Å. Therefore, for future devices to have a $t_{eq}$ less than about 10 Å, other dielectrics than $SiO_2$ need to be considered for use as a gate dielectric.

For a typical dielectric layer used as a gate dielectric, the capacitance is determined as one for a parallel plate capacitance: $C=\kappa\epsilon_0 A/t$, where $\kappa$ is the dielectric constant, $\epsilon_0$ is the permittivity of free space, A is the area of the capacitor, and t is the thickness of the dielectric. The thickness, t, of a material is related to its $t_{eq}$ for a given capacitance, with $SiO_2$ having a dielectric constant $\kappa_{ox}=3.9$, as $$t=(\kappa/\kappa_{ox})t_{eq}=(\kappa/3.9)t_{eq}.$$

Thus, materials with a dielectric constant greater than that of $SiO_2$, 3.9, will have a physical thickness that can be considerably larger than a desired $t_{eq}$ while providing the desired equivalent oxide thickness. For example, an alternate dielectric material with a dielectric constant of 10 could have a thickness of about 25.6 Å to provide a $t_{eq}$ of 10 Å, not including any depletion/inversion layer effects. Thus, a reduced equivalent oxide thickness for transistors can be realized by using dielectric materials with higher dielectric constants than $SiO_2$.

The thinner equivalent oxide thickness required for lower transistor operating voltages and smaller transistor dimensions may be realized by a significant number of materials, but additional fabricating requirements makes determining a suitable replacement for $SiO_2$ difficult. The current view for the microelectronics industry is still for Si based devices. This requires that the gate dielectric employed be grown on a silicon substrate or silicon layer, which places significant restraints on the substitute dielectric material. During the formation of the dielectric on the silicon layer, there exists the possibility that a small layer of $SiO_2$ could be formed in addition to the desired dielectric. The result would effectively be a dielectric layer consisting of two sublayers in parallel with each other and the silicon layer on which the dielectric is formed. In such a case, the resulting capacitance would be that of two dielectrics in series. As a result, the $t_{eq}$ of the dielectric layer would be the sum of the $SiO_2$ thickness and a multiplicative factor of the thickness of the dielectric being formed, written as $$t_{eq} = t_{SiO_2} + (\kappa_{ox}/\kappa)t.$$

Thus, if a $SiO_2$ layer is formed in the process, the $t_{eq}$ is again limited by a $SiO_2$ layer. In the event that a barrier layer is formed between the silicon layer and the desired dielectric in which the barrier layer prevents the formation of a $SiO_2$ layer, the $t_{eq}$ would be limited by the layer with the lowest dielectric constant. However, whether a single dielectric layer with a high dielectric constant or a barrier layer with a higher dielectric constant than $SiO_2$ is employed, the layer interfacing with the silicon layer must provide a high quality interface to maintain a high channel carrier mobility.

One of the advantages using $SiO_2$ as a gate dielectric has been that the formation of the $SiO_2$ layer results in an amorphous gate dielectric. Having an amorphous structure for a gate dielectric is advantageous because grain boundaries in polycrystalline gate dielectrics provide high leakage paths. Additionally, grain size and orientation changes throughout a polycrystalline gate dielectric can cause variations in the film's dielectric constant. Some materials having the advantage of a high dielectric constants relative to $SiO_2$ also have the disadvantage of a crystalline form, at least in a bulk configuration. The best candidates for replacing $SiO_2$ as a gate dielectric are those with high dielectric constant, which can be fabricated as a thin layer with an amorphous form.

Materials such as $HfO_2$ offer the prospects of a $SiO_2$ substitute with its high dielectric constants and thermal stability on silicon. However, there are reliability concerns associated with the ability of oxygen ions to diffuse through these oxides leaving vacancies that can act as traps. Additionally, $HfO_2$ tends to crystallize at low temperatures, which forms polycrystalline films with high-leakage paths along grain boundaries. However, hafnium silicates or pseudobinary alloys MSiO with M=Hf provide stability against crystallization and a high dielectric constant higher relative to mixtures of $HfO_2$ and $SiO_2$. However, MSiO layers tend to crystalizes during high temperature processing. It has been determined that the addition of nitrogen to compounds such as HfSiO provides thermal stability allowing such a layer to remain amorphous as the layer is cycled through higher temperatures in subsequent device processing.

HfSiON dielectric films grown by reactive sputtering using a HfSi target and by conventional MOS flow have recently been found to provide excellent electrical properties while maintaining thermal stability with respect to forming an amorphous dielectric film in contact with a silicon layer. Such properties include a leakage current that is two orders of magnitude lower than that of a $SiO_2$ layer with about the same equivalent oxide thickness, a dielectric constant in the range of 12–14, and equivalent oxide thickness of 11 Å to 13 Å with the expected ability to scale below 10 Å. See, A. Shanware et al.,"Reliability Evaluation of HfSiON Gate Dielectric Film with 12.8 Å $SiO_2$ Equivalent Thickness," 2001 *International Electron Devices Meeting*, pp. 137–40 (2001), A. L. P. Rotondaro et al., "Advanced CMOS Transistors with a Novel HfSiON Gate Dielectric," 2002 *Symposium on VLSI Technology Digest of Technical Papers*, pp. 148–9 (2002), and M. R. Visokay et al.," "Application of HfSiON as a Gate Dielectric Material," *Applied Physics Letters*, vol. 80, no. 17, pp. 3183–3185 (2002). However, forming oxide films on silicon surfaces by reactive sputtering generally results in an unwanted $SiO_2$ interfacial layer due to oxidation of the Si surface by the $O_2$ containing sputter plasma. This $SiO_2$ interfacial layer limits the ultimate equivalent oxide thickness scaling that can be attained using these methods.

In an embodiment according to the teachings of the present invention, a HfSiON dielectric film is formed using atomic layer deposition (ALD) having a substantially reduced or no interfacial $SiO_2$ layer. ALD, also known as atomic layer epitaxy (ALE), was developed in the early 1970's as a modification of chemical vapor deposition (CVD) and is also called "alternatively pulsed-CVD." In ALD, gaseous precursors are introduced one at a time to the substrate surface mounted within a reaction chamber (or reactor). This introduction of the gaseous precursors takes the form of pulses of each gaseous precursor. Between the pulses, the reaction chamber is purged with a gas, which in many cases is an inert gas, or evacuated.

In a chemisorption-saturated ALD (CS-ALD) process, during the first pulsing phase, reaction with the substrate occurs with the precursor saturatively chemisorbed at the substrate surface. Subsequent pulsing with a purging gas removes precursor excess from the reaction chamber.

The second pulsing phase introduces another precursor on the substrate where the growth reaction of the desired film takes place. Subsequent to the film growth reaction, reaction byproducts and precursor excess are purged from the reaction chamber. With favourable precursor chemistry where the precursors adsorb and react with each other on the substrate aggressively, one ALD cycle can be preformed in less than one second in properly designed flow type reaction chambers. Typically, precursor pulse times range from about 0.5 sec to about 2 to 3 seconds.

In ALD, the saturation of all the reaction and purging phases makes the growth self-limiting. This self-limiting growth results in large area uniformity and conformality, which has important applications for such cases as planar substrates, deep trenches, and in the processing of porous silicon and high surface area silica and alumina powders. Significantly, ALD provides for controlling film thickness in a straightforward manner by controlling the number of growth cycles.

ALD was originally developed to manufacture luminescent and dielectric films needed in electroluminescent displays. Significant efforts have been made to apply ALD to the growth of doped zinc sulfide and alkaline earth metal sulfide films. Additionally, ALD has been studied for the growth of different epitaxial II–V and II–VI films, nonepitaxial crystalline or amorphous oxide and nitride films and multilayer structures of these. There also has been considerable interest towards the ALD growth of silicon and germanium films, but due to the difficult precursor chemistry, this has not been very successful.

The precursors used in an ALD process may be gaseous, liquid or solid. However, liquid or solid precursors must be volatile. The vapor pressure must be high enough for effective mass transportation. Also, solid and some liquid precursors need to be heated inside the reaction chamber and introduced through heated tubes to the substrates. The necessary vapor pressure must be reached at a temperature below the substrate temperature to avoid the condensation of the precursors on the substrate. Due to the self-limiting growth mechanisms of ALD, relatively low vapor pressure solid precursors can be used though evaporation rates may somewhat vary during the process because of changes in their surface area.

There are several other requirements for precursors used in ALD. The precursors must be thermally stable at the substrate temperature because their decomposition would destroy the surface control and accordingly the advantages of the ALD method which relies on the reaction of the precursor at the substrate surface. Of course, a slight decomposition, if slow compared to the ALD growth, can be tolerated.

The precursors have to chemisorb on or react with the surface, though the interaction between the precursor and the surface as well as the mechanism for the adsorption is different for different precursors. The molecules at the substrate surface must react aggressively with the second precursor to form the desired solid film. Additionally, precursors should not react with the film to cause etching, and precursors should not dissolve in the film. Using highly reactive precursors in ALD contrasts with the selection of precursors for conventional CVD.

The by-products in the reaction must be gaseous in order to allow their easy removal from the reaction chamber. Further, the by-products should not react or adsorb on the surface.

In a reaction sequence ALD (RS-ALD) process, the self-limiting process sequence involves sequential surface chemical reactions. RS-ALD relies on chemistry between a reactive surface and a reactive molecular precursor. In an RS-ALD process, molecular precursors are pulsed into the ALD reaction chamber separately. The metal precursor reaction at the substrate is typically followed by an inert gas pulse to remove excess precursor and by-products from the reaction chamber prior to pulsing the next precursor of the fabrication sequence.

By RS-ALD, films can be layered in equal metered sequences that are all identical in chemical kinetics, deposition per cycle, composition, and thickness. RS-ALD sequences generally deposit less than a full layer per cycle. Typically, a deposition or growth rate of about 0.25 to about 2.00 Å per RS-ALD cycle can be realized.

The advantages of RS-ALD include continuity at an interface, conformality over a substrate, use of low temperature and mildly oxidizing processes, growth thickness dependent solely on the number of cycles performed, and ability to engineer multilayer laminate films with resolution of one to two monolayers. RS-ALD allows for deposition control on the order on monolayers and the ability to deposit monolayers of amorphous films.

In an embodiment, a layer of HfSiON is formed on a substrate mounted in a reaction chamber using ALD in a repetitive sequence using precursor gases individually pulsed into the reaction chamber. Alternately, solid or liquid precursors can be used in an appropriately designed reaction chamber. ALD formation of other materials is disclosed in co-pending, commonly assigned U.S. patent application: entitled "Atomic Layer Deposition and Conversion," Ser. No. 10/137,058, and "Methods, Systems, and Apparatus for Atomic-Layer Deposition of Aluminum Oxides in Integrated Circuits," Ser. No. 10/137,168.

Figure 2A:
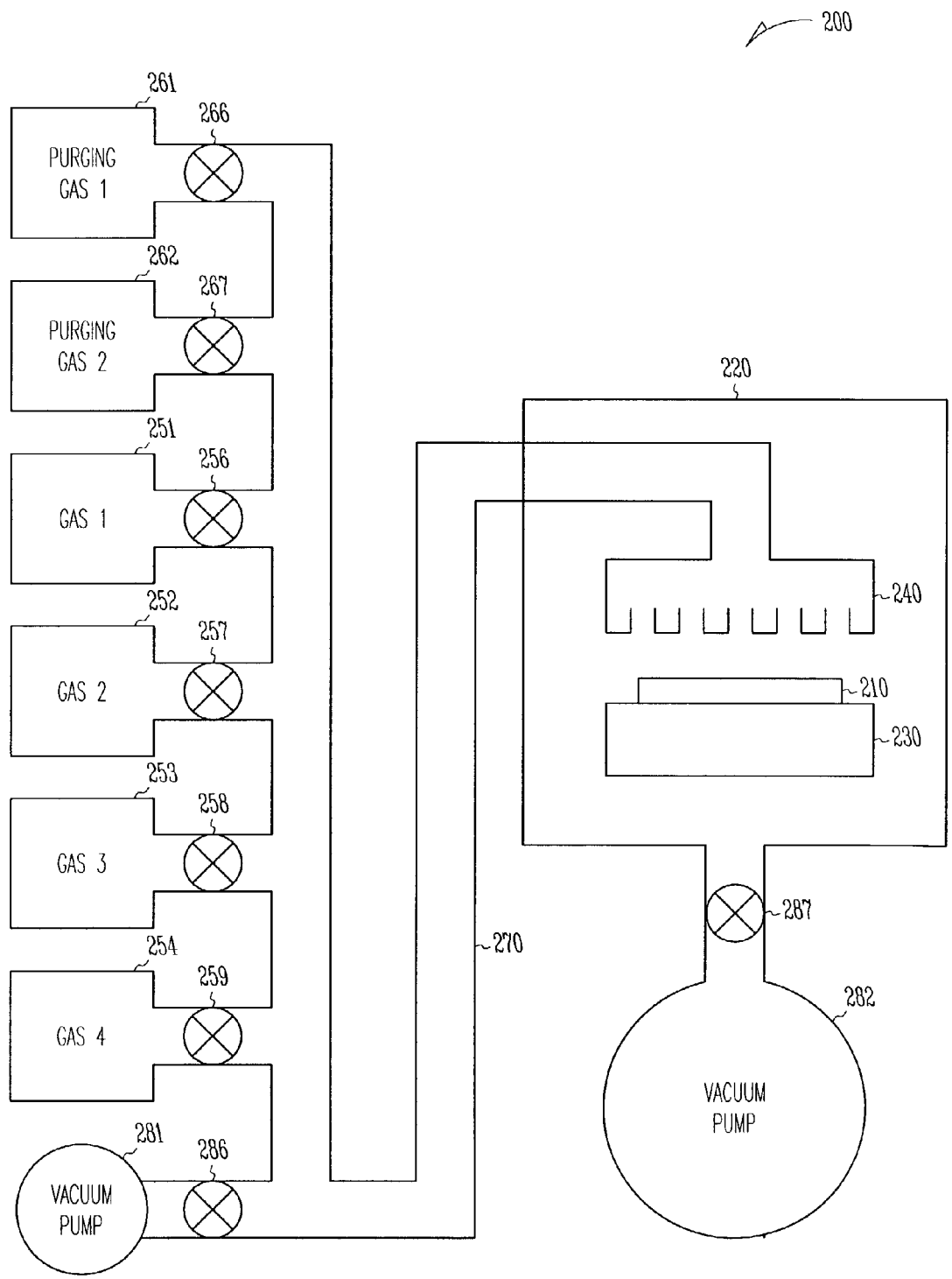
FIG. 2A shows an embodiment of an atomic layer deposition system for processing a dielectric film containing HfSiON, according to the teachings of the present invention.

FIG. 2A shows an embodiment of an atomic layer deposition system 200 for processing a dielectric film containing HfSiON, according to the teachings of the present invention. The elements depicted are those elements necessary for discussion of the present invention such that those skilled in the art may practice the present invention without undue experimentation. A further discussion of the ALD reaction chamber can be found in co-pending, commonly assigned U.S. patent application: entitled "Methods, Systems, and Apparatus for Uniform Chemical-Vapor Depositions," Ser. No. 09/797,324, incorporated herein by reference.

In FIG. 2A, a substrate 210 is located inside a reaction chamber 220 of ALD system 200. Also located within the reaction chamber 220 is a heating element 230 which is thermally coupled to substrate 210 to control the substrate temperature. A gas-distribution fixture 240 introduces precursor gases to the substrate 210. Each precursor gas originates from individual gas sources 251–254 whose flow is controlled by mass-flow controllers 256–259, respectively. The gas sources 251–254 provide a precursor gas either by storing the precursor as a gas or by providing a location and apparatus for evaporating a solid or liquid material to form the selected precursor gas.

Also included in the ALD system are purging gas sources 261, 262, each of which is coupled to mass-flow controllers 266, 267, respectively. Furthermore, additional purging gas sources can be constructed in ALD system 200, one purging gas source for each precursor gas. For a process that uses the same purging gas for multiple precursor gases less purging gas sources are required for ALD system 200. The gas sources 251–254 and the purging gas sources 261–262 are coupled by their associated mass-flow controllers to a common gas line or conduit 270 which is coupled to the gas-distribution fixture 240 inside the reaction chamber 220. Gas conduit 270 is also coupled to vacuum pump, or exhaust pump, 281 by mass-flow controller 286 to remove excess precursor gases, purging gases, and by-product gases at the end of a purging sequence from the gas conduit.

Vacuum pump, or exhaust pump, 282 is coupled by mass-flow controller 287 to remove excess precursor gases, purging gases, and by-product gases at the end of a purging sequence from the reaction chamber 220. For convenience, control displays, mounting apparatus, temperature sensing devices, substrate maneuvering apparatus, and necessary electrical connections as are known to those skilled in the art are not shown in FIG. 2A.

Figure 2B:
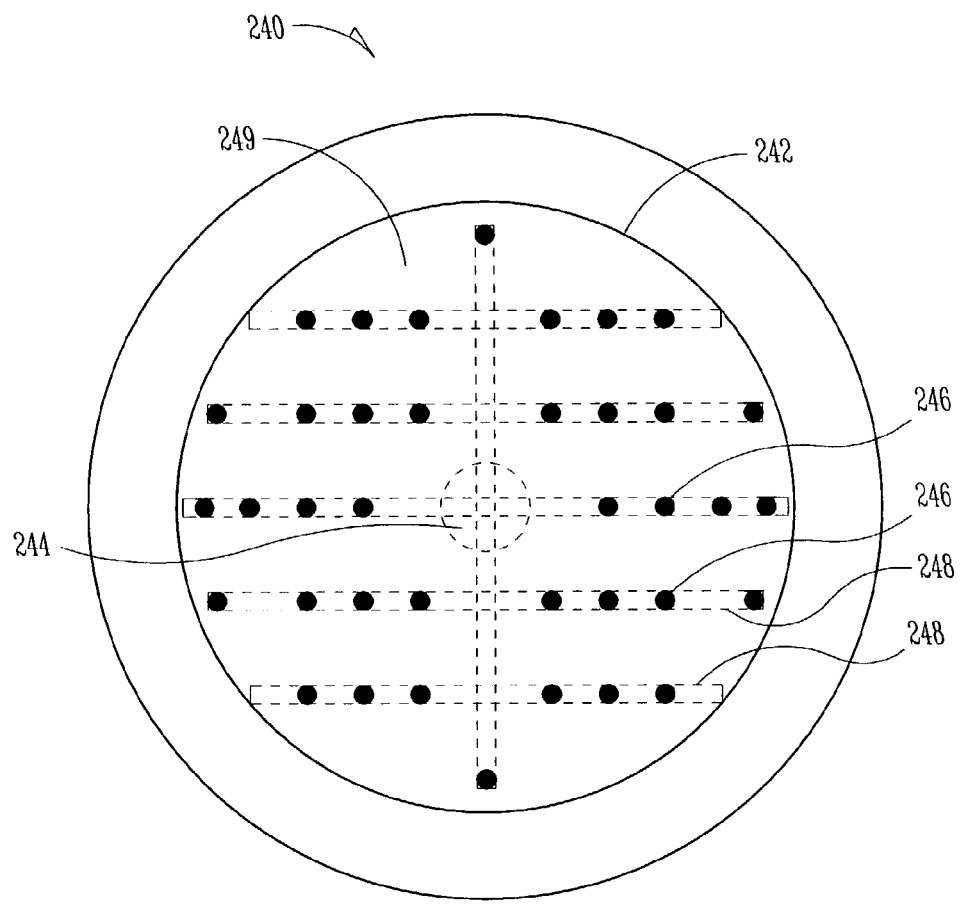
FIG. 2B shows an embodiment of a gas-distribution fixture of an atomic layer deposition chamber for processing a dielectric film containing HfSiON, according to the teachings of the present invention.

FIG. 2B shows an embodiment of a gas-distribution fixture 240 of atomic layer deposition chamber 200 for processing a dielectric film containing HfSiON, according to the teachings of the present invention. Gas-distribution fixture 240 includes a gas-distribution member 242, and a gas inlet 244. Gas inlet 244 couples the gas-distribution member 242 to the gas conduit 270 of FIG. 2A. Gas-distribution member 242 includes gas-distribution holes, or orifices, 246 and gas-distribution channels 248. In the exemplary embodiment, holes 246 are substantially circular with a common diameter in the range of 15–20 microns, gas-distribution channels 248 have a common width in the range of 20–45 microns. The surface 249 of the gas distribution member having gas-distribution holes 246 is substantially planar and parallel to the substrate 210 of FIG. 2A. However, other embodiments use other surface forms as well as shapes and sizes of holes and channels. The distribution and size of holes may also affect deposition thickness and thus might be used to assist thickness control. Holes 246 are coupled through gas-distribution channels 248 to gas inlet 244. Though ALD system 200 is well suited for practicing the present invention, other ALD systems commercially available can be used.

The use, construction and fundamental operation of reaction chambers for deposition of films are understood by those of ordinary skill in the art of semiconductor fabrication. The present invention man be practiced on a variety of such reaction chambers without undue experimentation. Furthermore, one of ordinary skill in the art will comprehend the necessary detection, measurement, and control techniques in the art of semiconductor fabrication upon reading the disclosure.

The elements of ALD system 200 can be controlled by a computer. To focus on the use of ALD system 200 in the various embodiments of the present invention, the computer is not shown. Those skilled in the art can appreciate that the individual elements such as pressure control, temperature control, and gas flow within ALD system 200 can be under computer control. In one embodiment, instructions stored in a computer readable medium are executed by a computer to accurately control the integrated functioning of the elements of ALD system 200 to form a dielectric film containing HfSiON.

Figure 3:
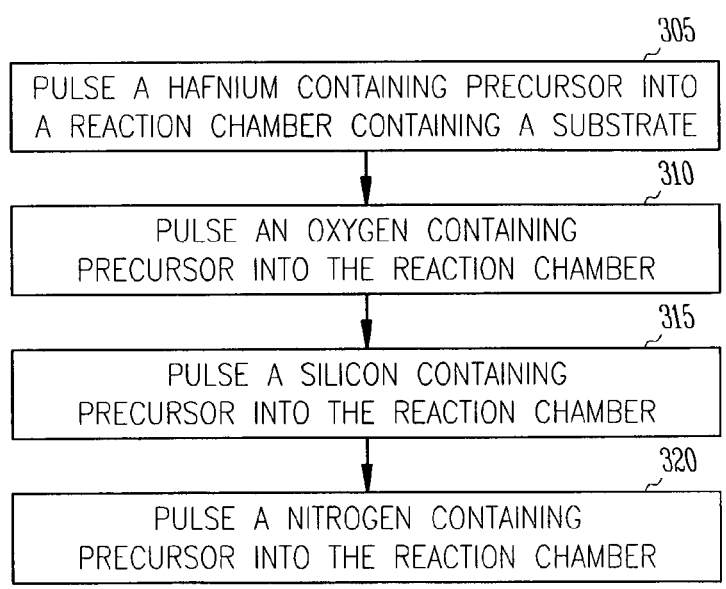
FIG. 3 illustrates a flow diagram of elements for an embodiment of a method to process a dielectric film containing HfSiON by atomic layer deposition, according to the teachings of the present invention.

FIG. 3 illustrates a flow diagram of elements for an embodiment of a method to process a dielectric film containing HfSiON by atomic layer deposition, according to the teachings of the present invention. This embodiment of a method for forming a HfSiON dielectric film by atomic layer deposition includes pulsing a hafnium containing precursor into a reaction chamber containing a substrate, at block 305, pulsing an oxygen containing precursor into the reaction chamber, at block 310, pulsing a silicon containing precursor into the reaction chamber, at block 315, and pulsing a nitrogen containing precursor into the reaction chamber at block 320.

Atomic layer deposition of the individual components of the HfSiON layer allows for individual control of each precursor pulsed into the reaction chamber. Thus, each each precursor is pulsed into the reaction chamber for a predetermined period, where the predetermined period can be set separately for each precursor. Additionally, each precursor can be pulsed into the reaction under separate environmental conditions. The substrate can be maintained at a selected temperature and the reaction chamber maintained at a selected pressure independently for pulsing each precursor. In one embodiment, the substrate is maintained at about 500° C. for each pulsing of all precursors into the reaction chamber.

Using atomic layer deposition, the pulsing of the precursor gases is separated by purging the reaction chamber with a purging gas following each pulsing of a precursor. In one embodiment, nitrogen gas is used as the purging gas following the pulsing of each precursor used in a cycle to form a layer of HfSiON. Additionally, the reaction chamber can also be purged by evacuating the reaction chamber.

By using atomic layer deposition to form HfSiON dielectric films, the thickness of the dielectric layer can be accurately controlled including forming ultra thin layers. HfSiON dielectric films having thicknesses of several monolayers can be formed by repeating for a number of cycles the pulsing of the hafnium containing precursor, the pulsing of the oxygen containing precursor, the pulsing of the silicon containing precursor, and the pulsing of the nitrogen containing precursor into the reaction chamber. Each cycle will produce substantially the same thickness of material, that is, processing under the same environmental conditions and pulsing times for each precursor results in a growth rate of a constant number of angstroms per cycle. Thus, the thickness can be engineered by controlling the numbers of cycle. Depending on the precursor used and the environmental conditions, a minimal pulsing time is necessary for complete interaction of the precursor over the substrate surface. Pulsing times are selected to enable the controlled growth of the HfSiON layer on a one to two monolayer basis Typically, one to three seconds of pulsing will provide the necessary duration for surface interaction. A purging gas such as nitrogen is pulsed for a longer period such as five to fifteen seconds to insure that all excess precursor gases and by-products are removed from the reaction chamber.

Figure 4:
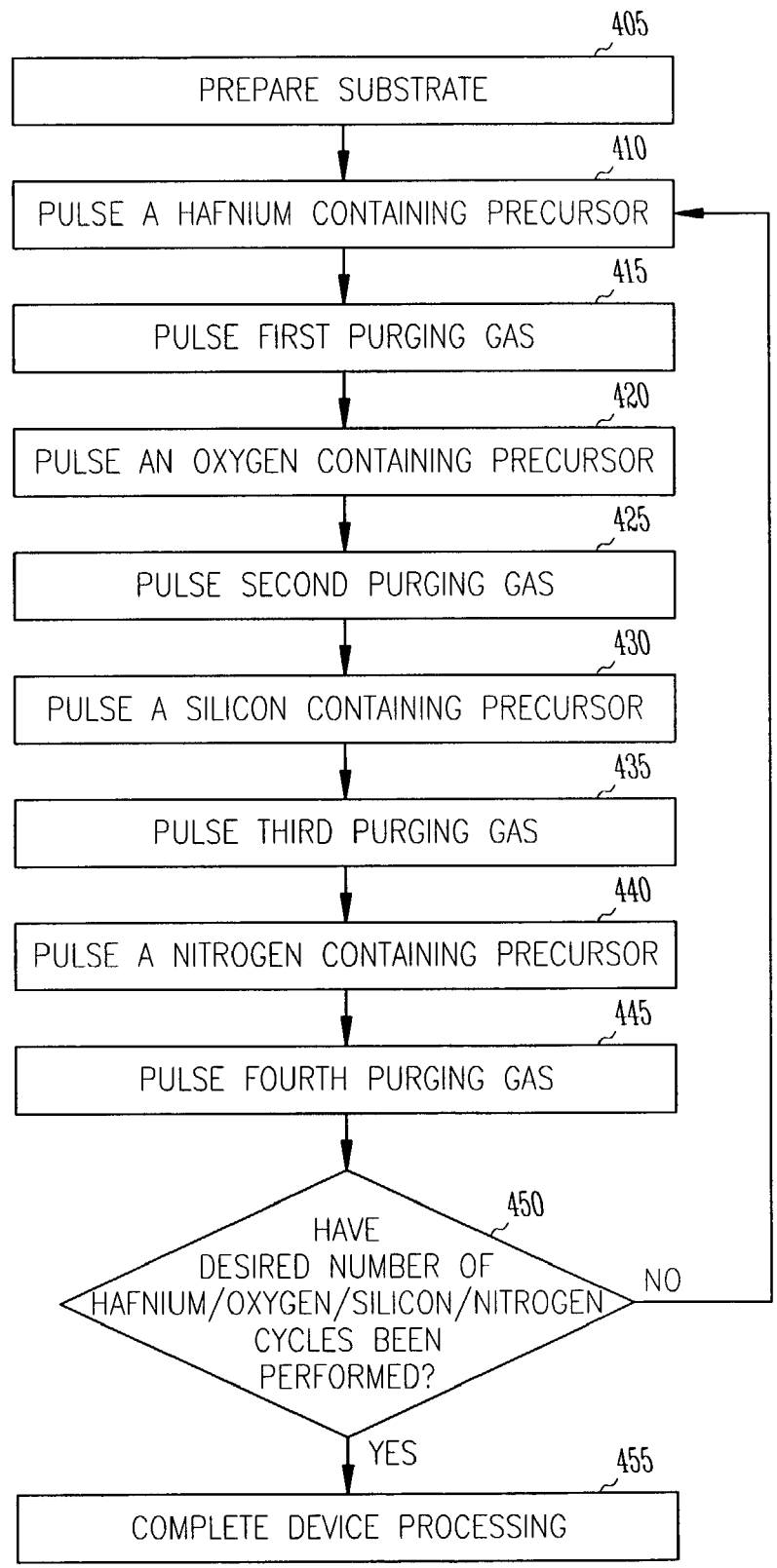
FIG. 4 illustrates a flow diagram of elements for another embodiment of a method to process a dielectric film containing HfSiON by atomic layer deposition, according to the teachings of the present invention.

FIG. 4 illustrates a flow diagram of elements for another embodiment of a method to process a dielectric film containing HfSiON by atomic layer deposition, according to the teachings of the present invention. An embodiment of this method can be implemented with the atomic layer deposition system 200 of FIGS. 2A,B.

At block 405, a substrate is prepared. The substrate used for forming a transistor is typically a silicon or silicon containing material. In other embodiments, germanium, gallium arsenide, silicon-on-sapphire substrates, or other suitable substrates may be used. This preparation process includes cleaning of the substrate 210 and forming layers and regions of the substrate, such as drains and sources of a metal oxide semiconductor (MOS) transistor, prior to forming a gate dielectric. The sequencing of the formation of the regions of the transistor being processed follows typical sequencing that is generally performed in the fabrication of a MOS transistor as is well known to those skilled in the art. Included in the processing prior to forming a gate dielectric is the masking of substrate regions to be protected during the gate dielectric formation, as is typically performed in MOS fabrication. In this embodiment, the unmasked region includes a body region of a transistor, however one skilled in the art will recognize that other semiconductor device structures may utilize this process. Additionally, the substrate 210 in its ready for processing form is conveyed into a position in reaction chamber 220 for ALD processing.

In one embodiment, a cycle for forming HfSiON includes a hafnium containing precursor/oxygen containing precursor sequence followed by a silicon containing precursor/nitrogen containing precursor sequence. Alternate embodiments include cycles having sequences for pulsing the four precursors in all the possible combinational orders.

At block 410, a precursor containing hafnium is pulsed into reaction chamber 220. In an embodiment, $HfI_4$ is used as a precursor. The $HfI_4$ is pulsed into reaction chamber 220 through the gas-distribution fixture 240 onto substrate 210. The flow of the $HfI_4$ is controlled by mass-flow controller 256 from gas source 251. In one embodiment, the substrate temperature is maintained between about 225° C. and about 500° C. In another embodiment, the substrate temperature is maintained between about 250° C. and about 325° C. The HfI$_4$ reacts with the surface of the substrate 210 in the desired region defined by the unmasked areas of the substrate 210.

In another embodiment, HfCl$_4$ is used as a precursor. The HfCl$_4$ is pulsed into reaction chamber 220 through the gas-distribution fixture 240 onto substrate 210. The flow of the HfCl$_4$ is controlled by mass-flow controller 256 from gas source 251. The HfCl$_4$ source gas temperature ranges from about 130° C. at about 154° C. The HfCl$_4$ reacts with the surface of the substrate 210 in the desired region defined by the unmasked areas of the substrate 210.

At block 415, a first purging gas is pulsed into the reaction chamber 220. In particular, pure nitrogen with a purity greater than 99.99% is used as a purging gas for HfI$_4$ and HfCL$_4$ sequences. The nitrogen flow is controlled by mass-flow controller 266 from the purging gas source 261 into the gas conduit 270. Using the pure nitrogen purge avoids overlap of the precursor pulses and possible gas phase reactions. A nitrogen gas can also be used as a carrier gas for the precursors. Following the purge, an oxygen containing precursor is pulsed into the reaction chamber 220, at block 420. For the hafnium sequence using HfI$_4$ or HfCl$_4$ as the precursor, water vapor is selected as the precursor acting as a reactant to form a Hf and 0 on the substrate 210. Alternately, a vapor solution of H$_2$O—H$_2$O$_2$ can be used as the oxygen containing precursor. The water vapor is pulsed into the reaction chamber 220 through gas conduit 270 from gas source 252 by mass-flow controller 257. The water vapor aggressively reacts at the surface of substrate 210. For a HfCl$_4$/water vapor sequence, the water vapor is pulsed into the reaction chamber 220 with a flow rate ranging from about 0.5 to about 1.0 mPa m$^3$/sec.

Following the pulsing of an oxygen containing precursor, a second purging gas is injected into the reaction chamber 220, at block 425. In the HfI$_4$/water vapor sequence and in the HfCL$_4$/water vapor sequence, pure nitrogen gas is used to purge the reaction chamber after pulsing each precursor gas. Excess precursor gas, and reaction by-products are removed from the system by the purge gas in conjunction with the exhausting of the reaction chamber 220 using vacuum pump 282 through mass-flow controller 287, and exhausting of the gas conduit 270 by the vacuum pump 281 through mass-flow controller 286.

During a HfI$_4$/water vapor sequence, the substrate is held between about 250° C. and about 325° C. by the heating element 230. In other embodiments the substrate is held between about 225° C. and 500° C. The HfI$_4$ pulse time ranges from about 1.0 sec to about 2.0 sec. After the HfI$_4$ pulse, the hafnium sequence continues with a purge pulse followed by a water vapor pulse followed by a purge pulse. In one embodiment, performing a purge pulse followed by a water vapor pulse followed by a purge pulse takes about 2 seconds. In another embodiment, each pulse in the hafnium sequence has a 2 second pulse period. In another embodiment, the pulse periods for the precursors are 2 seconds, while the purge gas pulse period ranges from five second to twenty seconds.

During a HfCl$_4$/water vapor sequence, the substrate is held between about 350° C. and about 550° C. by the heating element 230 with the reaction chamber 220 used in a low pressure (250 Pa) hot wall configuration. In other embodiments the substrate is held between about 500° C. and 1000° C. The HfCl$_4$ pulse time ranges from about 1.0 sec to about 2.0 sec. After the HfCl$_4$ pulse, the hafnium/water vapor sequence continues with a purge pulse followed by a water vapor pulse followed by a purge pulse. In one embodiment, performing a purge pulse followed by a water vapor pulse followed by a purge pulse takes about two seconds. In another embodiment, each pulse in the hafnium/water vapor sequence after the HfCl$_4$ pulse has about a two second pulse period. In another embodiment, the pulse periods for the precursors are about two seconds, while the purge gas pulse period ranges from about five seconds to about twenty seconds.

At block 430, a silicon containing precursor is pulsed into the reaction chamber 220. In one embodiment, SiCl$_4$ is used as the silicon containing precursor, and is pulsed to the surface of the substrate 210 through gas-distribution fixture 240 from gas source 253 by mass-flow controller 258. For the pulsing of the SiCl$_4$ precursor, the substrate is maintained at a temperature ranging from about 340° C. to about 375° C. at a gas pressure in reaction chamber 220 of about 170 Torr.

At block 435, a third purging gas is introduced into the system. For a SiCl$_4$ precursor, nitrogen gas can also be used as a purging and carrier gas. The nitrogen flow is controlled by mass-flow controller 267 from the purging gas source 262 into the gas conduit 270 and subsequently into the reaction chamber 220. Following the nitrogen purge, at block 440, a nitrogen containing precursor is pulsed into the reaction chamber 220. In one embodiment, NH$_3$ is used as the nitrogen containing precursor.

The NH$_3$ is pulsed into the reaction chamber 220 through gas conduit 270 from gas source 254 by mass-flow controller 259. For the pulsing of the SiCl$_4$ precursor, the substrate is maintained at about 550° C. at a gas pressure in reaction chamber 220 of about 300 Torr. The NH$_3$ aggressively reacts at the surface of substrate 210.

Following the pulsing of the NH$_3$, a fourth purging gas is injected into the reaction chamber 220, at block 445. In the SiCl$_4$/NH$_3$ sequence, nitrogen gas is used to purge the reaction chamber after pulsing each precursor gas. In another embodiment, argon gas is used as the purging gas. Excess precursor gas, and reaction by-products are removed from the system by the purge gas in conjunction with the exhausting of the reaction chamber 220 using vacuum pump 282 through mass-flow controller 287, and exhausting of the gas conduit 270 by the vacuum pump 281 through mass-flow controller 286.

Completing the sequences for pulsing of the hafnium containing precursor, pulsing the oxygen containing precursor, pulsing the silicon containing precursor, pulsing the nitrogen containing precursor along with the four purging gas sequences between the precursor sequences defines a cycle for forming a layer of HfSiON.

At block 450, a determination is made as to whether a desired thickness of the HfSiON layer has been formed. The thickness of a HfSiON film after one cycle is determined by a fixed growth rate for the pulsing periods and precursors used, set at a value such as N nm/cycle. For a desired HfSiON film thickness, t, in an application such as forming a gate dielectric of a MOS transistor, the ALD process is repeated for t/N cycles. The desired thickness is attained after t/N cycles. If less than t/N cycles have been completed, the process starts over at block 410 with the pulsing of the hafnium containing precursor. If t/N cycles have completed, no further ALD processing for HfSiON is required.

Upon completing the formation of the HfSiON dielectric layer, the dielectric layer can be annealed. In one embodiment, the dielectric layer is annealed at about 550° C. in an NH$_3$ atmosphere. The HfSiON formed is amorphous and remains amorphous at higher temperatures than the 550° C. annealing temperature. Alternately, the annealing can be performed at a temperature between about 300° C. and about 800° C. in an inert or nitrogen atmosphere.

At block 455, after forming the HfSiON, processing the device having the dielectric layer containing HfSiON is completed. In one embodiment, completing the device includes completing the formation of a transistor. In another embodiment, completing the device includes completing the formation of a capacitor. Alternately, completing the process includes completing the construction of a memory device having a array with access transistors formed with gate dielectrics containing HfSiON. Further, in another embodiment, completing the process includes the formation of an electronic system including an information handling device that uses electronic devices with transistors formed with dielectric films containing atomic layer deposited HfSiON. Typically, information handling devices such as computers include many memory devices, having many access transistors.

Atomic layer deposition of a HfSiON dielectric layer can be processed in a atomic layer deposition system such as ALD system 200 under computer control to perform the previously discussed processes. In an embodiment, a computerized method for forming a dielectric film includes controlling an environment of a reaction chamber containing a substrate, pulsing a hafnium containing precursor into the reaction chamber, pulsing an oxygen containing precursor into the reaction chamber, pulsing a silicon containing precursor into the reaction chamber, and pulsing a nitrogen containing precursor into the reaction chamber. Additionally, the computerized method controls the pulsing of four purging gases, one for each precursor gas and pulsing each purging gas after pulsing the associated precursor gas. An embodiment of this method can be realized using ALD system 200 of FIG. 2A, where the controls for the individual elements of ALD system 200 are coupled to a computer, not shown in FIG. 2A.

The computer provides control of the operation for processing a HfSiON dielectric layer by regulating the flow of precursor gases into reaction chamber 220. The computer can control the flow rate of precursor gases and the pulsing periods for these gases by controlling mass-flow controllers 256–259. Additionally, the computer can control the temperature of gas sources 251–254. Further, the pulse period and flow of purging gases from purging gas sources 261, 262 can be regulated through computer control of mass-flow controllers 266, 267, respectively.

The computer can also regulate the environment of reactor chamber 220 in which a dielectric film is being formed on substrate 210. The computer regulates the pressure in reaction chamber 220 within a predetermined pressure range by controlling vacuum pumps 281, 282 through mass-flow controllers 286, 287, respectively. The computer also regulates the temperature range for substrate 210 within a predetermined range by controlling heater 230.

For convenience, the individual control lines to elements of ALD 200, as well as a computer, are not shown in FIG. 2A. The above description of the computer control in conjunction with FIG. 2A provides information for those skilled in the art to practice embodiments for forming a dielectric layer containing HfSiON using a computerized method as described herein.

A computer for controlling the elements of ALD system 200 of FIG. 2A operates under computer-executable instructions to perform a method for forming a HfSiON dielectric film by atomic layer deposition that can include controlling an environment of a reaction chamber containing a substrate, pulsing a hafnium containing precursor into the reaction chamber, pulsing an oxygen containing precursor into the reaction chamber, pulsing a silicon containing precursor into the reaction chamber, and pulsing a nitrogen containing precursor into the reaction chamber. Additionally, the computerized method controls the pulsing of four purging gases, one for each precursor gas and pulsing each purging gas after pulsing the associated precursor gas. Using a computer to control parameters for growing the dielectric film provides for processing the dielectric film over a wide range of parameters allowing for the determination of an optimum parameter set for the ALD system used. The computer-executable instructions can be provided in any computer-readable medium. Such computer-readable medium includes, but is not limited to, floppy disks, diskettes, hard disks, CD-ROMS, flash ROMS, nonvolatile ROM, and RAM.

In an embodiment, dielectric layers containing HfSiON can be grown with varying percentages of each of the components. Such layers can be engineered using ALD processing by varying the sequence of deposition. For example, a HfSiON film rich in Hf—O can be formed by eliminating the Si—N sequence in a large number of process cycles. With only a few cycles using the Si—N sequence, the resultant HfSiON film would approach that of $HfO_2$ doped with Si and N. Such a film would have a dielectric constant approaching that of $HfO_2$ with Si and N added to provide enhanced thermal stability as an amorphous film, that is, crystallization of such a thin film would occur at temperatures higher than those for crystallizing $HfO_2$ without Si and N added. Thus, engineering the ALD sequences to provide a HfSiON rich in Hf—O could be used in applications where subsequent device processing is at elevated temperatures, but under a temperature for the HfSiON to crystallize. Lowering the Hf content will increase the crystallization temperature. Alternately, a HfSiON dielectric film can be engineered to have a low Hf—O content which will remain amorphous at subsequent device processing temperatures, but the associated dielectric constant is at the lower end for a dielectric layer containing HfSiON near that of silicon nitride at about 7–9. Thus, by designing a process with cycles having different sequences of the four precursors, dielectric films containing HfSiON can be engineered that meet the requirements for subsequent device process processing and remain amorphous to provide low leakage current and a dielectric constant significantly greater than that of $SiO_2$.

In one embodiment where a hafnium containing precursor is pulsed followed by pulsing an oxygen containing precursor and subsequently pulsing a silicon containing precursor and pulsing a nitrogen containing precursor, the process can be viewed as a hafnium/oxygen sequence followed by a silicon/nitrogen sequence. A hafnium/oxygen sequence by itself could result in forming a layer containing $HfO_2$, which has a dielectric constant of about 25. A silicon/nitrogen sequence by itself could result in forming a layer containing silicon nitride, which has a dielectric constant of about 7. A material film composed of bulk layers of HfSiON should have a dielectric constant ranging from about 7 to about 25. However, thin layers of a material, typically, have dielectric constants somewhat less than their bulk counterparts. For thin HfSiON films, a dielectric constant ranges from about 12 to about 14. In some embodiments, the dielectric constant ranges from about 7 to about 14.

Another factor setting a lower limit for the scaling of a dielectric layer is the number of monolayers of the dielectric structure necessary to develop a full band gap such that good insulation is maintained between an underlying silicon layer and an overlying conductive layer on the dielectric layer or film. This requirement is necessary to avoid possible short circuit effects between the underlying silicon layer and the overlying conductive layer used. In one embodiment, forming monolayers of HfSiON monolayers, a lower limit for the physical thickness of a dielectric layer grown by forming HfSiON occurs at about the 1–3 nm range. Further, using ALD for processing a HfSiON dielectric layer, the transitions between such a layer and a silicon substrate can be engineered to be abrupt or graded. Thus, the layer thickness and the nature of the interface between the layer and the silicon substrate can be engineered to provide the desired electrical characteristics.

The physical thicknesses can range from about 1 nm to about 10 nm with typical thickness ranging from about 1 or 2 nm to about 4 nm, with effective dielectric constants ranging from 7 to 14. The expected $t_{eq}$ ranges for various effective dielectric constants are shown in the following:

| κ | Physical Thickness t = 1.0 nm (10 Å) $t_{eq}$ (Å) | Physical Thickness t = 2.0 nm (20 Å) $t_{eq}$ (Å) | Physical Thickness t = 4.0 nm (40 Å) $t_{eq}$ (Å) | Physical Thickness t = 10.0 nm (100 Å) $t_{eq}$ (Å) |
|---|---|---|---|---|
| 7  | 5.57 | 11.14 | 22.29 | 21.67 |
| 9  | 4.43 | 8.67  | 17.33 | 11.47 |
| 12 | 3.25 | 6.50  | 13.00 | 9.29  |
| 14 | 2.79 | 5.57  | 11.14 | 7.8   |

As mentioned, the lower limit on the scaling of a layer containing HfSiON depends on the monolayers of the film necessary to develop a full band gap such that good insulation is maintained between an underlying silicon layer and an overlying conductive layer to the HfSiON film. From above, it is apparent that a film containing HfSiON can be attained with a $t_{eq}$ ranging from 3 Å to 13 Å. Further, a dielectric film with completely formed band structures and monolayer formations can provide a $t_{eq}$ significantly less than 2 or 3 Å.

The novel process described above provides significant advantages by performing atomic layer deposition of HfSiON to control the thickness of the dielectric layer formed. In addition to providing thickness in the monolayer range, atomic layer deposition provides for substantially smooth surfaces and limited interfacial layer formation. Additionally, the novel process can be implemented to form transistors, capacitors, memory devices, and other electronic systems including information handling devices. With careful preparation and engineering of the HfSiON layer, limiting the size of interfacial regions, a teq of about 3 Å or lower is anticipated.

A transistor 100 as depicted in FIG. 1 can be formed by forming a source region 120 and a drain region 130 in a silicon based substrate 110 where source and drain regions 120, 130 are separated by a body region 132. Body region 132 defines a channel having a channel length 134. A dielectric film is disposed on substrate 110 by forming a layer containing HfSiON on substrate 110 in a reaction chamber by atomic layer deposition. The resulting HfSiON dielectric layer forms gate dielectric 140.

A gate 150 is formed over gate dielectric 140. Typically, forming gate 150 includes forming a polysilicon layer, though a metal gate can be formed in an alternative process. Forming the substrate, the source and drain regions, and the gate is performed using standard processes known to those skilled in the art. Additionally, the sequencing of the various elements of the process for forming a transistor is conducted with standard fabrication processes, also as known to those skilled in the art.

Figure 5:
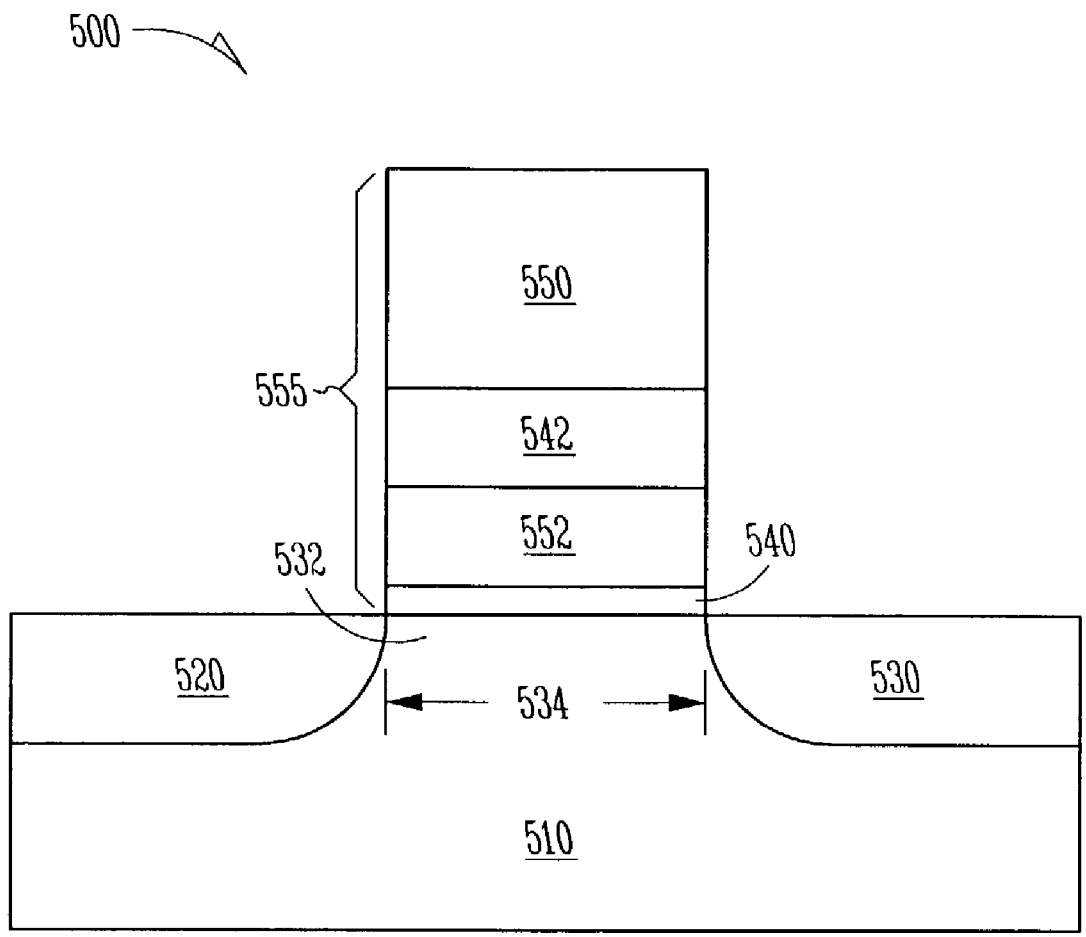
FIG. 5 shows an embodiment of a configuration of a transistor having an atomic layer deposited HfSiON dielectric film, according to the teachings of the present invention.

The method for forming a HfSiON dielectric film in various embodiments can be applied to other transistor structures having dielectric layers. FIG. 5 shows an embodiment of a configuration of a transistor having an atomic layer deposited HfSiON dielectric film, according to the teachings of the present invention. In the embodiment of FIG. 5, transistor 500 includes a silicon based substrate 510 with a source 520 and a drain 530 separated by a body region 532. Body region 532 defines a channel region having a channel length 534. Located above body region 532 is a stack 555 including a gate dielectric 540, a floating gate 552, a floating gate dielectric 542, and a control gate 550. Gate dielectric 540 can be formed as described above with the remaining elements of transistor 500 formed using processes known to those skilled in the art. Alternately, both gate dielectric 540 and floating gate dielectric 542 can be formed as dielectric layers containing atomic layer deposited HfSiON in various embodiments as described herein.

The embodiments of methods for forming HfSiON dielectric films can also be applied to forming capacitors in various integrated circuits, memory devices, and electronic systems. In one embodiment for forming a capacitor, a method includes forming a first conductive layer on a substrate, forming a dielectric film containing HfSiON on the first conductive layer, and forming a second conductive layer on the dielectric film. The dielectric film containing HfSiON is formed by an atomic layer deposition including pulsing a hafnium containing precursor into a reaction chamber containing the substrate, pulsing an oxygen containing precursor into the reaction chamber, pulsing a silicon containing precursor into the reaction chamber, and pulsing a nitrogen containing precursor into the reaction chamber. Alternately, a capacitor can be formed by forming a conductive layer on a substrate, forming a dielectric film containing atomic layer deposited HfSiON using any of the embodiments described herein, and forming another conductive layer on the dielectric film.

Figure 6:
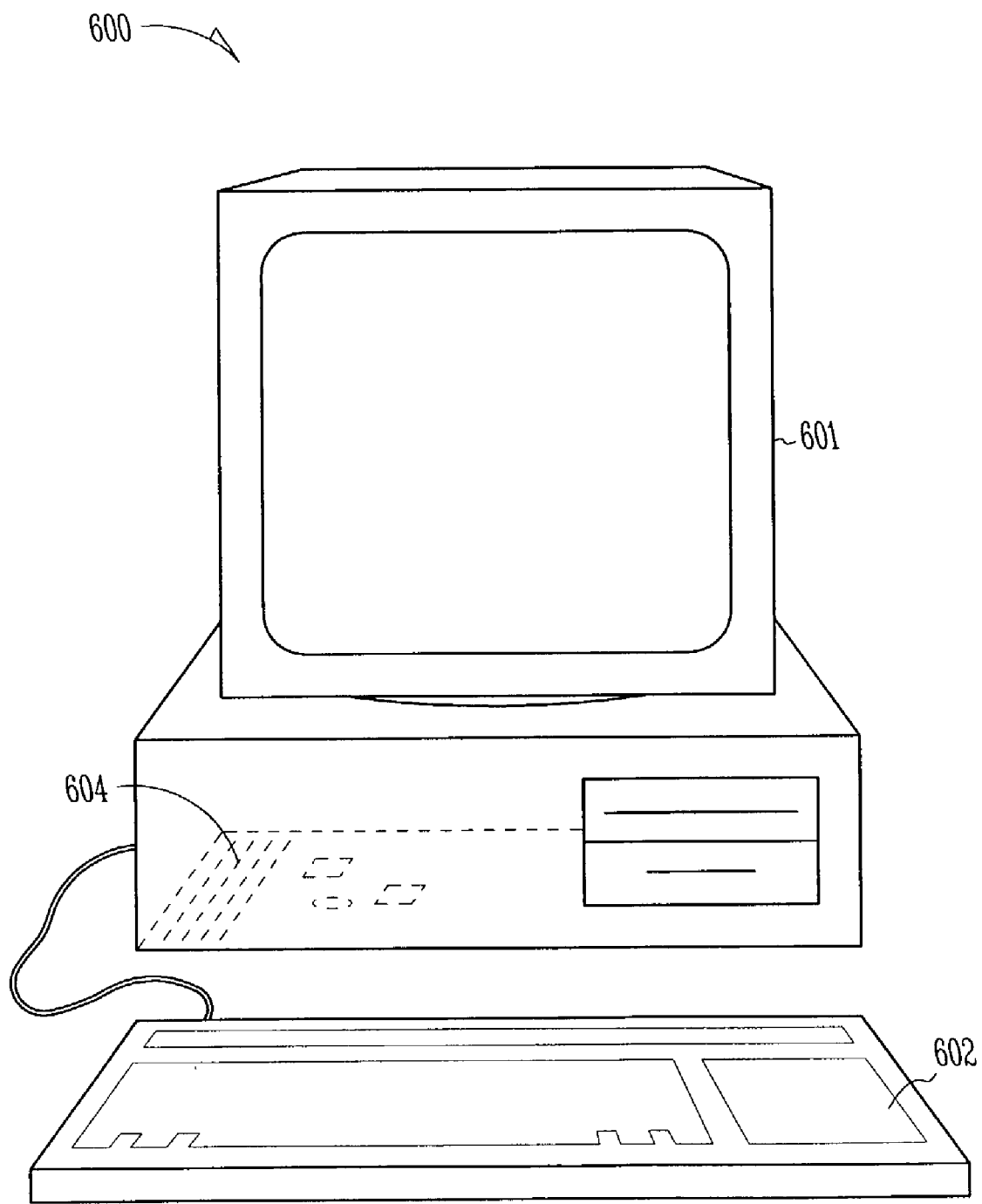
FIG. 6 shows an embodiment of a personal computer incorporating devices having an atomic layer deposited HfSiON dielectric film, according to the teachings of the present invention.
Figure 7:
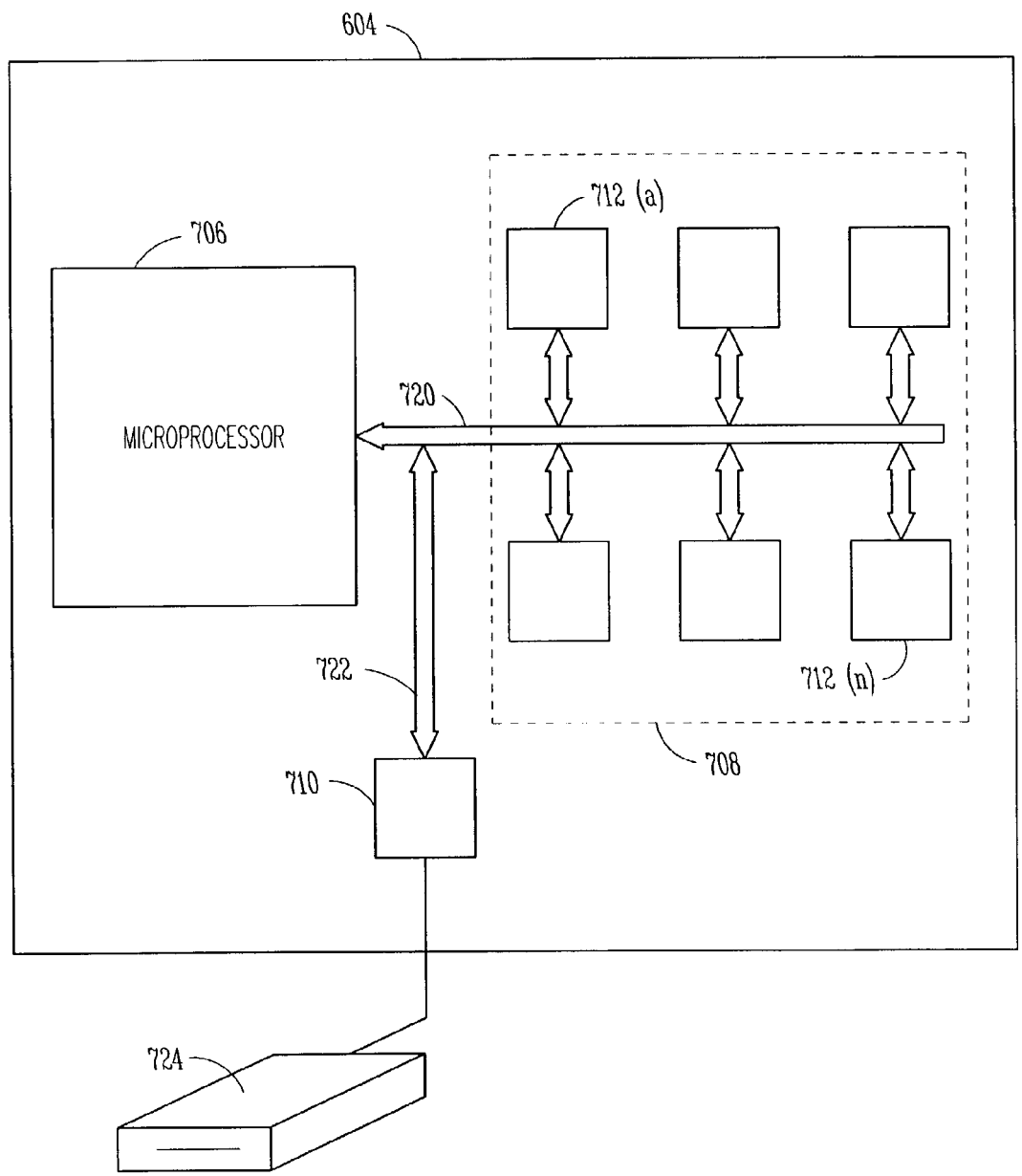
FIG. 7 illustrates a schematic view of an embodiment of a central processing unit incorporating devices having an atomic layer deposited HfSiON dielectric film, according to the teachings of the present invention.
Figure 8:
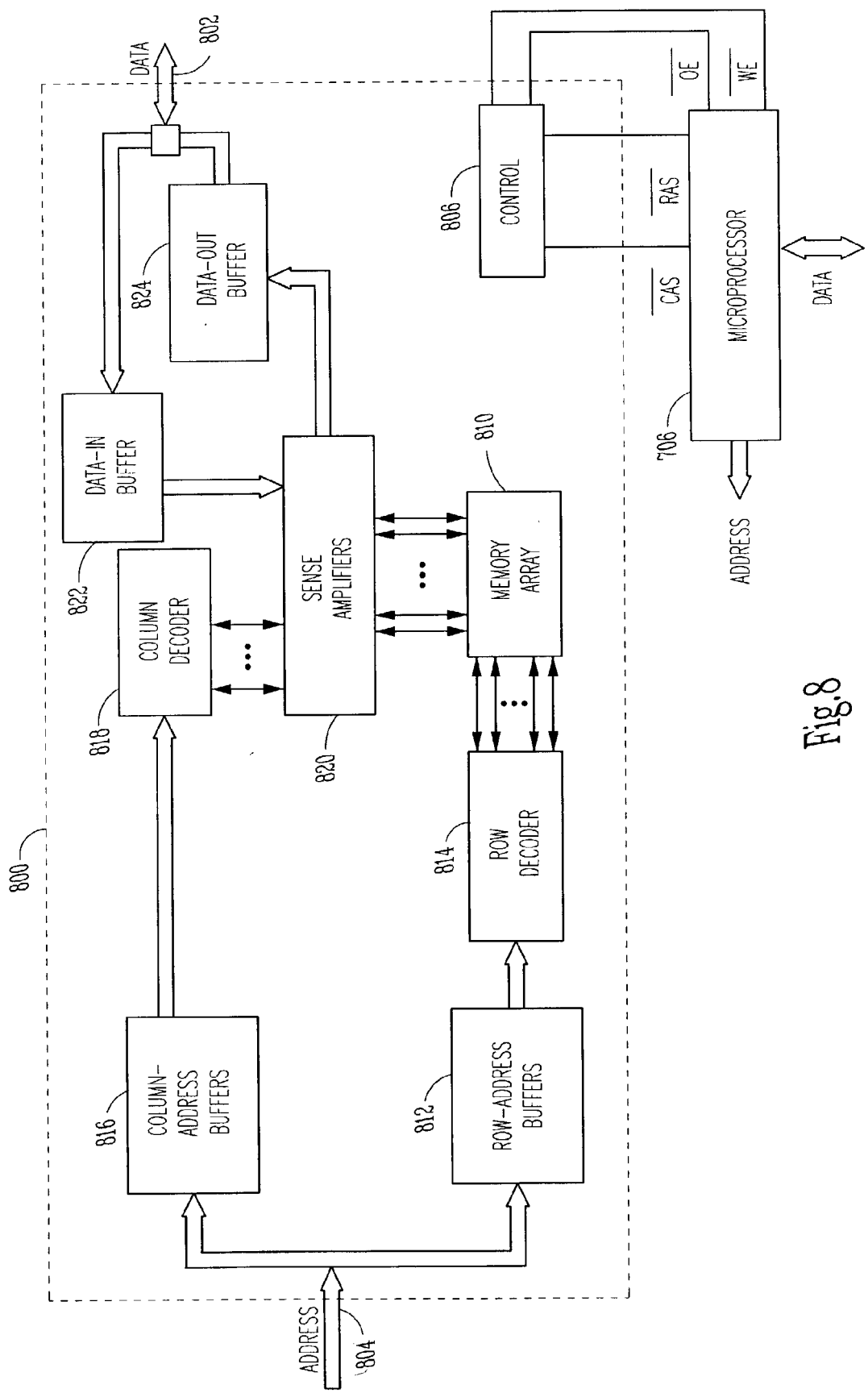
FIG. 8 illustrates a schematic view of an embodiment of a DRAM memory device having an atomic layer deposited HfSiON dielectric film, according to the teachings of the present invention.

Transistors, capacitors, and other devices having dielectric films created by the methods described above may be implemented into memory devices and electronic systems including information handling devices. Information handling devices having a dielectric layer containing atomic layer deposited HfSiON can be constructed using various embodiments of the methods described above. Such information devices can include wireless systems, telecommunication systems, and computers. An embodiment of a computer having a dielectric layer containing atomic layer deposited HfSiON is shown in FIGS. 6–8 and described below. While specific types of memory devices and computing devices are shown below, it will be recognized by one skilled in the art that several types of memory devices and electronic systems including information handling devices utilize the invention.

A personal computer, as shown in FIGS. 6 and 7, can include a monitor 600, keyboard input 602 and a central processing unit 604. Processor unit 604 typically includes a microprocessor 706, a memory bus circuit 708 having a plurality of memory slots 712(a–n), and other peripheral circuitry 710. Peripheral circuitry 710 permits various peripheral devices 724 to interface processor-memory bus 720 over input/output (I/O) bus 722. The personal computer shown in FIGS. 6 and 7 also includes at least one transistor having a gate dielectric containing atomic layer deposited HfSiON according an embodiment of the present invention.

Microprocessor 706 produces control and address signals to control the exchange of data between memory bus circuit 708 and microprocessor 706 and between memory bus circuit 708 and peripheral circuitry 710. This exchange of data is accomplished over high speed memory bus 720 and over high speed I/O bus 722.

Coupled to memory bus 720 are a plurality of memory slots 712(a–n) which receive memory devices well known to those skilled in the art. For example, single in-line memory modules (SIMMs) and dual in-line memory modules (DIMMs) may be used in the implementation of embodiment of the present invention.

These memory devices can be produced in a variety of designs which provide different methods of reading from and writing to the dynamic memory cells of memory slots 712. One such method is the page mode operation. Page mode operations in a DRAM are defined by the method of accessing a row of a memory cell arrays and randomly accessing different columns of the array. Data stored at the row and column intersection can be read and output while that column is accessed. Page mode DRAMs require access steps which limit the communication speed of memory circuit 708.

An alternate type of device is the extended data output (EDO) memory which allows data stored at a memory array address to be available as output after the addressed column has been closed. This memory can increase some communication speeds by allowing shorter access signals without reducing the time in which memory output data is available on memory bus 720. Other alternative types of devices include SDRAM, DDR SDRAM, SLDRAM and Direct RDRAM as well as others such as SRAM or Flash memories.

FIG. 8 illustrates a schematic view of an embodiment of a DRAM memory device having an atomic layer deposited HfSiON dielectric film, according to the teachings of the present invention. Illustrative DRAM memory device 800 is compatible with memory slots 712(a–n). The description of DRAM memory device 800 has been simplified for purposes of illustrating a DRAM memory device and is not intended to be a complete description of all the features of a DRAM. Those skilled in the art will recognize that a wide variety of memory devices may be used in the implementation of embodiments of the present invention. The embodiment of a DRAM memory device shown in FIG. 8 includes at least one transistor having a gate dielectric containing atomic layer deposited HfSiON.

Control, address and data information provided over memory bus 720 is further represented by individual inputs to DRAM 800, as shown in FIG. 8. These individual representations are illustrated by data lines 802, address lines 804 and various discrete lines directed to control logic 806.

As is well known in the art, DRAM 800 includes memory array 810 which in turn comprises rows and columns of addressable memory cells. Each memory cell in a row is coupled to a common word line. The word line is coupled to gates of individual transistors, where at least one transistor has a gate coupled to a gate dielectric containing HfSiON in accordance with the method and structure previously described above. Additionally, each memory cell in a column is coupled to a common bit line. Each cell in memory array 810 includes a storage capacitor and an access transistor as is conventional in the art.

DRAM 800 interfaces with, for example, microprocessor 706 through address lines 804 and data lines 802. Alternatively, DRAM 800 may interface with a DRAM controller, a micro-controller, a chip set or other electronic system. Microprocessor 706 also provides a number of control signals to DRAM 800, including but not limited to, row and column address strobe signals RAS and CAS, write enable signal WE, an output enable signal OE and other conventional control signals.

Row address buffer 812 and row decoder 814 receive and decode row addresses from row address signals provided on address lines 804 by microprocessor 706. Each unique row address corresponds to a row of cells in memory array 810. Row decoder 814 includes a word line driver, an address decoder tree, and circuitry which translates a given row address received from row address buffers 812 and selectively activates the appropriate word line of memory array 810 via the word line drivers.

Column address buffer 816 and column decoder 818 receive and decode column address signals provided on address lines 804. Column decoder 818 also determines when a column is defective and the address of a replacement column. Column decoder 818 is coupled to sense amplifiers 820. Sense amplifiers 820 are coupled to complementary pairs of bit lines of memory array 810.

Sense amplifiers 820 are coupled to data-in buffer 822 and data-out buffer 824. Data-in buffers 822 and data-out buffers 824 are coupled to data lines 802. During a write operation, data lines 802 provide data to data-in buffer 822. Sense amplifier 820 receives data from data-in buffer 822 and stores the data in memory array 810 as a charge on a capacitor of a cell at an address specified on address lines 804.

During a read operation, DRAM 800 transfers data to microprocessor 706 from memory array 810. Complementary bit lines for the accessed cell are equilibrated during a precharge operation to a reference voltage provided by an equilibration circuit and a reference voltage supply. The charge stored in the accessed cell is then shared with the associated bit lines. A sense amplifier of sense amplifiers 820 detects and amplifies a difference in voltage between the complementary bit lines. The sense amplifier passes the amplified voltage to data-out buffer 824.

Control logic 806 is used to control the many available functions of DRAM 800. In addition, various control circuits and signals not detailed herein initiate and synchronize DRAM 800 operation as known to those skilled in the art. As stated above, the description of DRAM 800 has been simplified for purposes of illustrating an embodiment of the present invention and is not intended to be a complete description of all the features of a DRAM. Those skilled in the art will recognize that a wide variety of memory devices, including but not limited to, SDRAMs, SLDRAMs, RDRAMs and other DRAMs and SRAMs, VRAMs and EEPROMs, may be used in the implementation of embodiments of the present invention. The DRAM implementation described herein is illustrative only and not intended to be exclusive or limiting.

CONCLUSION

A dielectric film containing atomic layer deposited HfSiON and a method of fabricating such a dielectric film produce a reliable dielectric film having an equivalent oxide thickness thinner than attainable using $SiO_2$. Dielectric films containing atomic layer deposited HfSiON formed using the methods described herein are thermodynamically stable such that the dielectric films formed will have minimal reactions with a silicon substrate or other structures during processing.

Capacitors, transistors, higher level ICs or devices, and electronic systems are constructed utilizing the novel process for forming a dielectric film having an ultra thin equivalent oxide thickness, $t_{eq}$. Gate dielectric layers or films containing atomic layer deposited HfSiON are formed having a dielectric constant ($\kappa$) substantially higher than that of silicon oxide, where the dielectric films are capable of a $t_{eq}$ thinner than 10 Å, thinner than the expected limit for $SiO_2$ gate dielectrics. At the same time, the physical thickness of the atomic layer deposited HfSiON dielectric film is much larger than the $SiO_2$ thickness associated with the $t_{eq}$ limit of $SiO_2$. Forming the relatively larger thickness provides advantages in processing gate dielectrics and other dielectric layers.

Dielectric layers containing atomic layer deposited HfSiON are amorphous with relatively low leakage current. Additionally, formation of the HfSiON by atomic layer deposition allows for the engineering of the relative concentrations of the HfSiON components and the limited occurrence of an unwanted $SiO_2$ interfacial layer. These properties of layers containing atomic layer deposited HfSiON allow for application as dielectric layers in numerous electronic devices and systems.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. It is to be understood that the above description is intended to be illustrative, and not restrictive. Combinations of the above embodiments, and other embodiments will be apparent to those of skill in the art upon reviewing the above description. The scope of the invention includes any other applications in which the above structures and fabrication methods are used. The scope of the invention should be determined with reference to the appended claims, along with the full scope of equivalents to which such claims are entitled.

What is claimed is:

1. A method comprising: forming a dielectric film containing a HfSiON layer on a substrate by atomic layer deposition including:
   pulsing a hafnium containing precursor into a reaction chamber containing the substrate;
   pulsing an oxygen containing precursor into the reaction chamber;
   pulsing a silicon containing precursor into the reaction chamber; and
   pulsing a nitrogen containing precursor into the reaction chamber, wherein each precursor is independently pulsed during at least one atomic layer deposition cycle to form HfSiON with the reaction chamber purged between each pulsing of the precursors.

2. The method of claim 1, wherein pulsing each precursor into the reaction chamber is controlled for a predetermined period, the predetermined period being individually controlled for each precursor pulsed into the reaction chamber.

3. The method of claim 1, wherein the method further includes maintaining the substrate at a selected temperature for each pulsing of a precursor, the selected temperature set independently for pulsing each precursor.

4. The method of claim 1, wherein each pulsing of a precursor is followed by purging the reaction chamber with a purging gas.

5. The method of claim 1, wherein the method further includes repeating for a number of cycles one or more of the pulsing of the hafnium containing precursor, the pulsing of the oxygen containing precursor, the pulsing of the silicon containing precursor, and the pulsing of the nitrogen containing precursor.

6. The method of claim 1, wherein the method further includes maintaining the substrate at about 500° C.

7. The method of claim 1, wherein each pulsing of a precursor is followed by purging the reaction chamber with nitrogen.

8. The method of claim 1, wherein pulsing a hafnium containing precursor into a reaction chamber containing a substrate includes pulsing a $HfCl_4$ precursor into the reaction chamber.

9. The method of claim 8, wherein the method further includes maintaining the substrate at a selected temperature for each pulsing of a precursor, the selected temperature set independently for pulsing each precursor, the selected temperature set at a temperature in the range from about 350° C. to about 550° C.

10. The method of claim 1, wherein pulsing a hafnium containing precursor into a reaction chamber containing a substrate includes pulsing a $HfI_4$ precursor into the reaction chamber.

11. The method of claim 10, wherein the method further includes maintaining the substrate at a selected temperature for each pulsing of a precursor, the selected temperature set independently for pulsing each precursor, the selected temperature set in the range from about 225° C. to about 500° C. during the pulsing of the $HfI_4$ precursor.

12. The method of claim 1, wherein pulsing an oxygen containing precursor into the reaction chamber includes pulsing water vapor or a vapor solution of $H_2O$—$H_2O_2$ into the reaction chamber.

13. The method of claim 1, wherein pulsing a silicon containing precursor into the reaction chamber includes pulsing a $SiCl_4$ precursor into the reaction chamber.

14. The method of claim 13, wherein the method further includes maintaining the substrate at a selected temperature for each pulsing of a precursor, the selected temperature set independently for pulsing each precursor, the selected temperature set in the range from about 340° C. to about 375° C. during the pulsing of the $SiCl_4$ precursor.

15. The method of claim 1, wherein pulsing a nitrogen containing precursor into the reaction chamber includes pulsing a $NH_3$ precursor into the reaction chamber.

16. The method of claim 15, wherein the substrate is maintained at a selected temperature for each pulsing of a precursor, the selected temperature set independently for pulsing each precursor, the selected temperature set at about 550° C. during the pulsing of the $NH_3$ precursor.

17. The method of claim 1, wherein the method further includes $NH_3$ annealing at about 550° C.

18. A method comprising: forming a dielectric film containing a HfSiON layer on a substrate by atomic layer deposition including:
   pulsing $HfCl_4$ into a reaction chamber containing the substrate;
   pulsing an oxygen containing precursor into the reaction chamber;
   pulsing $SiCl_4$ into the reaction chamber; and
   pulsing a nitrogen containing precursor into the reaction chamber, wherein each precursor is independently pulsed during at least one atomic layer deposition cycle to form HfSiON with the reaction chamber purged between each pulsing of the precursors.

19. The method of claim 18, wherein the method further includes forming the HfSiON layer as an amorphous HfSiON layer.

20. The method of claim 18, wherein the method further includes annealing the dielectric film containing a HfSiON layer at temperatures ranging from about 300° C. to about 500° C.

21. The method of claim 18, wherein forming a dielectric film containing a HfSiON layer includes forming the dielectric film with a dielectric constant ranging from about 7 to about 25.

22. A method comprising: forming a dielectric film containing a HfSiON layer on a substrate by atomic layer deposition including:
pulsing $HfI_4$ into a reaction chamber containing the substrate;
pulsing an oxygen containing precursor into the reaction chamber;
pulsing $SiCl_4$ into the reaction chamber; and
pulsing a nitrogen containing precursor into the reaction chamber, wherein each precursor is independently pulsed during at least one atomic layer deposition cycle to form HfSiON with the reaction chamber purged between each pulsing of the precursors.

23. The method of claim 22, wherein the method further includes forming the HfSiON layer as a Hf—O rich HfSiON layer.

24. The method of claim 22, wherein the method further includes forming the HfSiON layer as an amorphous HfSiON layer.

25. The method of claim 22, wherein the method further includes annealing the dielectric film containing a HfSiON layer at temperatures ranging from about 300° C. to about 500° C.

26. A method comprising: forming a dielectric film containing a HfSiON layer on a substrate by atomic layer deposition including:
pulsing $HfCl_4$ into a reaction chamber containing the substrate;
pulsing an oxygen containing precursor into the reaction chamber;
pulsing a silicon containing precursor into the reaction chamber; and
pulsing a $NH_3$ precursor into the reaction chamber, wherein each precursor is independently pulsed during at least one atomic layer deposition cycle to form HfSiON with the reaction chamber purged between each pulsing of the precursors.

27. The method of claim 26, wherein the method further includes forming the HfSiON layer with a physical thickness ranging from about 1 nm to about 10 nm.

28. The method of claim 26, wherein the method further includes forming the HfSiON layer as an amorphous HfSiON layer.

29. The method of claim 26, wherein the method further includes annealing the dielectric film containing a HfSiON layer at temperatures ranging from about 300° C. to about 500° C.

30. A method comprising: forming a dielectric film containing a HfSiON layer on a substrate by atomic layer deposition including:
pulsing $HfI_4$ into a reaction chamber containing the substrate;
pulsing an oxygen containing precursor into the reaction chamber;
pulsing a silicon containing precursor into the reaction chamber; and
pulsing a $NH_3$ precursor into the reaction chamber, wherein each precursor is independently pulsed during at least one atomic layer deposition cycle to form HfSiON with the reaction chamber purged between each pulsing of the precursors.

31. The method of claim 30, wherein the method further includes forming the HfSiON layer as a Hf—O rich HfSiON layer.

32. The method of claim 30, wherein the method further includes forming the HfSiON layer as an amorphous HfSiON layer.

33. The method of claim 32, wherein the method further includes annealing the dielectric film containing the HfSiON layer at temperatures such that the HfSiON remains amorphous.

34. A method comprising: forming a dielectric film containing a HfSiON layer on a substrate by atomic layer deposition including:
pulsing a hafnium containing precursor into a reaction chamber containing the substrate;
pulsing an oxygen containing precursor into the reaction chamber;
pulsing $SiCl_4$ into the reaction chamber; and
pulsing a $NH_3$ precursor into the reaction chamber, wherein each precursor is independently pulsed during at least one atomic layer deposition cycle to form HfSiON with the reaction chamber purged between each pulsing of the precursors.

35. The method of claim 34, wherein forming a dielectric film containing a HfSiON layer includes forming the dielectric film with a dielectric constant ranging from about 7 to about 25.

36. The method of claim 34, wherein the method further includes forming the HfSiON layer as an amorphous HfSiON layer.

37. The method of claim 34, wherein the method further includes annealing the dielectric film containing the HfSiON layer in a nitrogen atmosphere.

38. A method comprising: forming a dielectric film containing a HfSiON layer on a substrate by atomic layer deposition including:
pulsing $HfI_4$ into a reaction chamber containing the substrate;
pulsing an oxygen containing precursor into the reaction chamber;
pulsing $SiCl_4$ into the reaction chamber; and
pulsing a $NH_3$ precursor into the reaction chamber, wherein each precursor is independently pulsed during at least one atomic layer deposition cycle to form HfSiON with the reaction chamber purged between each pulsing of the precursors.

39. The method of claim 38, wherein the method further includes forming the HfSiON layer as a Hf—O rich HfSiON layer.

40. The method of claim 38, wherein the method further includes forming the HfSiON layer as an amorphous HfSiON layer.

41. The method of claim 38, wherein the method further includes forming the HfSiON layer with a physical thickness ranging from about 1 nm to about 4 nm.

42. The method of claim 1, wherein forming a dielectric film containing a HfSiON layer on a substrate includes forming the dielectric film as a capacitor dielectric disposed on an electrode of a capacitor.

43. The method of claim 1, wherein forming a dielectric film containing a HfSiON layer on a substrate includes forming the dielectric film as a gate dielectric separating a source and a drain of a transistor.

44. The method of claim 1, wherein forming a dielectric film containing a HfSiON layer on a substrate includes forming the dielectric film as a gate dielectric separating a source and a drain of a transistor in a memory device.

45. The method of claim 1, wherein the method includes forming the dielectric film containing a HfSiON layer as a gate dielectric separating a source and a drain of a transistor in a memory device and providing a bus to couple the memory device to a processor of an electronic system.

46. A method of forming a capacitor, comprising:
    forming a first conductive layer on a substrate;
    forming a dielectric film containing a HfSiON layer on the first conductive layer; and
    forming a second conductive layer on the dielectric film, wherein the dielectric film containing the HfSiON layer is formed by an atomic layer deposition including:
        pulsing a hafnium containing precursor into a reaction chamber containing the substrate;
        pulsing an oxygen containing precursor into the reaction chamber;
        pulsing a silicon containing precursor into the reaction chamber; and
        pulsing a nitrogen containing precursor into the reaction chamber, wherein each precursor is independently pulsed during at least one atomic layer deposition cycle to form HfSiON with the reaction chamber purged between each pulsing of the precursors.

47. The method of claim 46, wherein pulsing a hafnium containing precursor into a reaction chamber containing the substrate includes pulsing a $HfCl_4$ precursor into the reaction chamber.

48. The method of claim 46, wherein pulsing a hafnium containing precursor into a reaction chamber containing the substrate includes pulsing a $HfI_4$ precursor into the reaction chamber.

49. The method of claim 46, wherein pulsing an oxygen containing precursor into the reaction chamber includes pulsing water vapor or a vapor solution of $H_2O$—$H_2O_2$ into the reaction chamber.

50. The method of claim 46, wherein pulsing a silicon containing precursor into the reaction chamber includes pulsing a $SiCl_4$ precursor into the reaction chamber.

51. The method of claim 46, wherein pulsing a nitrogen containing precursor into the reaction chamber includes pulsing a $NH_3$ precursor into the reaction chamber.

52. The method of claim 46, wherein the method further includes $NH_3$ annealing at about 550° C.

53. A method of forming a transistor comprising:
    forming a source region and a drain region in a substrate;
    forming a body region between the source and drain regions;
    forming a dielectric film containing a HfSiON layer on the body region between the source and drain regions; and
    coupling a gate to the dielectric film, wherein the dielectric film containing the HfSiON layer is formed by an atomic layer deposition including:
        pulsing a hafnium containing precursor into a reaction chamber containing the substrate;
        pulsing an oxygen containing precursor into the reaction chamber;
        pulsing a silicon containing precursor into the reaction chamber; and
        pulsing a nitrogen containing precursor into the reaction chamber, wherein each precursor is independently pulsed during at least one atomic layer deposition cycle to form HfSiON with the reaction chamber purged between each pulsing of the precursors.

54. The method of claim 53, wherein the method further includes repeating for a number of cycles one or more of the pulsing of the hafnium containing precursor, the pulsing of the oxygen containing precursor, the pulsing of the silicon containing precursor, and the pulsing of the nitrogen containing precursor.

55. The method of claim 53, wherein pulsing a hafnium containing precursor into a reaction chamber containing the substrate includes pulsing a $HfCl_4$ precursor into the reaction chamber.

56. The method of claim 53, wherein pulsing a hafnium containing precursor into a reaction chamber containing a substrate includes pulsing a $HfI_4$ precursor into the reaction chamber.

57. The method of claim 53, wherein pulsing an oxygen containing precursor into the reaction chamber includes pulsing water vapor or a vapor solution of $H_2O$—$H_2O_2$ into the reaction chamber.

58. The method of claim 53, wherein pulsing a silicon containing precursor into the reaction chamber includes pulsing a $SiCl_4$ precursor into the reaction chamber.

59. The method of claim 53, wherein pulsing a nitrogen containing precursor into the reaction chamber includes pulsing a $NH_3$ precursor into the reaction chamber.

60. The method of claim 53, wherein the method further includes maintaining the substrate at about 500° C.

61. A method of forming a memory comprising:
    forming a number of access transistors, at least one of the access transistors including a dielectric film containing a HfSiON layer on a body region between a source region and a drain region formed on a substrate, the dielectric film containing the HfSiON layer formed by atomic layer deposition including:
        pulsing a hafnium containing precursor into a reaction chamber containing a the substrate;
        pulsing an oxygen containing precursor into the reaction chamber;
        pulsing a silicon containing precursor into the reaction chamber; and
        pulsing a nitrogen containing precursor into the reaction chamber, wherein each precursor is independently pulsed during at least one atomic layer deposition cycle to form HfSiON with the reaction chamber purged between each pulsing of the precursors;
    forming a number of word lines coupled to a number of the gates of the number of access transistors;
    forming a number of source lines coupled to a number of the source regions of the number of access transistors; and
    forming a number of bit lines coupled to a number of the drain regions of the number of access transistors.

62. The method of claim 61, wherein pulsing a hafnium containing precursor into a reaction chamber containing a substrate includes pulsing a $HfCl_4$ precursor into the reaction chamber.

63. The method of claim 61, wherein pulsing a hafnium containing precursor into a reaction chamber containing a substrate includes pulsing a HfI$_4$ precursor into the reaction chamber.

64. The method of claim 61, wherein pulsing an oxygen containing precursor into the reaction chamber includes pulsing water vapor or a vapor solution of H$_2$O—H$_2$O$_2$ into the reaction chamber.

65. The method of claim 61, wherein pulsing a silicon containing precursor into the reaction chamber includes pulsing a SiCl$_4$ precursor into the reaction chamber.

66. The method of claim 61, wherein pulsing a nitrogen containing precursor into the reaction chamber includes pulsing a NH$_3$ precursor into the reaction chamber.

67. A method of forming an electronic system comprising:
providing a processor;
coupling a memory to the processor, wherein the memory includes at least one access transistor having a dielectric film containing a HfSiON layer on a body region between a source region and a drain region formed on a substrate, the dielectric film containing the HfSiON layer formed by atomic layer deposition including:
pulsing a hafnium containing precursor into a reaction chamber containing the substrate;
pulsing an oxygen containing precursor into the reaction chamber;
pulsing a silicon containing precursor into the reaction chamber; and
pulsing a nitrogen containing precursor into the reaction chamber, wherein each precursor is independently pulsed during at least one atomic layer deposition cycle to form HfSiON with the reaction chamber purged between each pulsing of the precursors.

68. The method of claim 67, wherein pulsing a hafnium containing precursor into a reaction chamber containing a substrate includes pulsing a HfCl$_4$ precursor into the reaction chamber.

69. The method of claim 67, wherein pulsing a hafnium containing precursor into a reaction chamber containing a substrate includes pulsing a HfI$_4$ precursor into the reaction chamber.

70. The method of claim 67, wherein pulsing an oxygen containing precursor into the reaction chamber includes pulsing water vapor or a vapor solution of H$_2$O—H$_2$O$_2$ into the reaction chamber.

71. The method of claim 67, wherein pulsing a silicon containing precursor into the reaction chamber includes pulsing a SiCl$_4$ precursor into the reaction chamber.

72. The method of claim 67, wherein pulsing a nitrogen containing precursor into the reaction chamber includes pulsing a NH$_3$ precursor into the reaction chamber.

* * * * *

UNITED STATES PATENT AND TRADEMARK OFFICE
CERTIFICATE OF CORRECTION

PATENT NO. : 7,199,023 B2
APPLICATION NO. : 10/229903
DATED : April 3, 2007
INVENTOR(S) : Ahn et al.

It is certified that error appears in the above-identified patent and that said Letters Patent is hereby corrected as shown below:

On the face page, in field (54), in "Title", in column 1, line 1, delete "HFSION" and insert -- HfSiON --, therefor.

On page 2, in field (56), under "U.S. Patent Documents", in column 2, line 39, after "Ahn et al." delete "437/768" and insert -- 438/768 --, therefor.

On page 2, in field (56), under "U.S. Patent Documents", in column 2, line 40, after "Eldridge" insert -- et al. --.

On page 2, in field (56), under "U.S. Patent Documents", in column 2, line 72, after "6/2005" delete "Ajram" and insert -- Akram --, therefor.

On page 3, in field (56), under "Other Publications", in column 1, line 4, delete "oxidatin" and insert -- oxidation --, therefor.

On page 3, in field (56), under "Other Publications", in column 1, line 5, delete "Sio2" and insert -- $SiO_2$ --, therefor.

On page 3, in field (56), under "Other Publications", in column 2, line 3, delete "Lettters," and insert -- Letters, --, therefor.

On page 3, in field (56), under "Other Publications", in column 2, line 14, delete "depositon" and insert -- deposition --, therefor.

On page 3, in field (56), under "Other Publications", in column 2, line 16, delete "Tio2:" and insert -- $TiO_2$: --, therefor.

On page 3, in field (56), under "Other Publications", in column 2, line 17, delete "Lettters," and insert -- Letters, --, therefor.

On page 3, in field (56), under "Other Publications", in column 2, line 36, delete "LaAl03" and insert -- $LaAlO_3$ --, therefor.

On page 3, in field (56), under "Other Publications", in column 2, line 47, delete "characterizationof" and insert -- characterization of --, therefor.

On page 3, in field (56), under "Other Publications", in column 2, line 52, delete "presursor" and insert -- precursor --, therefor.

UNITED STATES PATENT AND TRADEMARK OFFICE
CERTIFICATE OF CORRECTION

PATENT NO.        : 7,199,023 B2
APPLICATION NO. : 10/229903
DATED              : April 3, 2007
INVENTOR(S)       : Ahn et al.

It is certified that error appears in the above-identified patent and that said Letters Patent is hereby corrected as shown below:

On page 3, in field (56), under "Other Publications", in column 2, line 63, delete "Physcis" and insert -- Physics --, therefor.

On page 3, in field (56), under "Other Publications", in column 2, line 68, delete "Zr02" and insert -- $ZrO_2$ --, therefor.

On page 4, in field (56), under "Other Publications", in column 1, line 17, delete "Fabriation" and insert -- Fabrication --, therefor.

On page 4, in field (56), under "Other Publications", in column 1, line 18, delete "Insulting" and insert -- Insulating --, therefor.

On page 4, in field (56), under "Other Publications", in column 1, line 31, delete "A M.," and insert -- S M., --, therefor.

On page 4, in field (56), under "Other Publications", in column 2, line 70, delete "Techinical" and insert -- Technical --, therefor.

On page 5, in field (56), under "Other Publications", in column 1, line 26, delete "Tranport" and insert -- Transport --, therefor.

On page 5, in field (56), under "Other Publications", in column 1, line 43, delete "fo rAlternative Gae Dielecric" and insert -- for Alternative Gate Dielectric --, therefor.

On page 5, in field (56), under "Other Publications", in column 2, line 13, delete "Tiox" and insert -- $TiO_x$ --, therefor.

In column 1, line 1, delete "HFSION" and insert -- HfSiON --, therefor.

In column 2, line 43, after "HfSiON" insert -- . --.

In column 5, line 1, after "$t_{eq}$" insert -- , --.

In column 5, line 29, delete "$^t SiO^2$" and insert -- $^t SiO_2$ --, therefor.

In column 9, line 19, delete "man" and insert -- may -- , therefor.

In column 9, line 50, after "Thus, each" delete "each". (second occurrence)

In column 10, line 19, after "basis" insert -- . --.

UNITED STATES PATENT AND TRADEMARK OFFICE
CERTIFICATE OF CORRECTION

PATENT NO. : 7,199,023 B2
APPLICATION NO. : 10/229903
DATED : April 3, 2007
INVENTOR(S) : Ahn et al.

It is certified that error appears in the above-identified patent and that said Letters Patent is hereby corrected as shown below:

In column 11, line 15, delete "HfCL$_4$" and insert -- HfCl$_4$ --, therefor.

In column 11, line 24, delete "0" and insert -- O --, therefor.

In column 11, line 36, delete "HfCL$_4$" and insert -- HfCl$_4$ --, therefor.

In column 15, line 52, delete "teq" and insert -- t$_{eq}$ --, therefor.

In column 24, line 46, in Claim 61, after "containing" delete "a".

Signed and Sealed this

Twelfth Day of June, 2007

JON W. DUDAS
*Director of the United States Patent and Trademark Office*